(12) United States Patent
Lee et al.

(10) Patent No.: US 10,989,847 B2
(45) Date of Patent: Apr. 27, 2021

(54) OPTICAL MODULE AND OPTICAL DEVICE USING SAME

(71) Applicant: Samsung Electronics Co., Ltd., Suwon-si (KR)

(72) Inventors: Kyeong Seok Lee, Seoul (KR); Gyu Weon Hwang, Seoul (KR); Won Mok Kim, Seoul (KR); In Ho Kim, Seoul (KR); Hyun Chul Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 195 days.

(21) Appl. No.: 16/071,950

(22) PCT Filed: Jul. 31, 2017

(86) PCT No.: PCT/KR2017/008258
§ 371 (c)(1),
(2) Date: Jul. 23, 2018

(87) PCT Pub. No.: WO2018/043926
PCT Pub. Date: Mar. 8, 2018

(65) Prior Publication Data
US 2019/0025482 A1    Jan. 24, 2019

(30) Foreign Application Priority Data

Aug. 30, 2016 (KR) .................. 10-2016-0110799
Apr. 26, 2017 (KR) .................. 10-2017-0053895

(51) Int. Cl.
*G02B 27/10* (2006.01)
*G02B 5/28* (2006.01)
(Continued)

(52) U.S. Cl.
CPC .............. *G02B 5/28* (2013.01); *G02B 5/201* (2013.01); *G05B 23/02* (2013.01);
(Continued)

(58) Field of Classification Search
CPC ................................ G02B 5/28; G02B 5/201
See application file for complete search history.

(56) References Cited

U.S. PATENT DOCUMENTS 6,995,840 B2    2/2006  Hagler
8,054,352 B2   11/2011  Kim et al.
(Continued)

FOREIGN PATENT DOCUMENTS

CN          1659424 A      8/2005
CN        101889346 A     11/2010
(Continued)

OTHER PUBLICATIONS

International Search Report PCT/ISA/210 for International Application No. PCT/KR2017/007258 dated Dec. 4, 2017.
(Continued)

*Primary Examiner* — Joseph P Martinez
(74) *Attorney, Agent, or Firm* — Harness, Dickey & Pierce, P.L.C.

(57) ABSTRACT

The present invention provides an optical device including a spectral filter and an optical detection unit for detecting light passing through the spectral filter. A band-limited filter is provided on the path of light.

20 Claims, 34 Drawing Sheets

(51) Int. Cl.
  *G05B 23/02*   (2006.01)
  *H01L 27/146*  (2006.01)
  *G02B 5/20*    (2006.01)

(52) U.S. Cl.
  CPC .... *H01L 27/1463* (2013.01); *H01L 27/14621* (2013.01); *H01L 27/14645* (2013.01)

(56) References Cited

U.S. PATENT DOCUMENTS

| | | |
|---|---|---|
| 9,013,691 B2 | 4/2015 | Golub et al. |
| 9,459,147 B2 | 10/2016 | Tatsuda et al. |
| 9,960,198 B2 | 5/2018 | Yokogawa |
| 2010/0271516 A1 | 10/2010 | Lee |
| 2014/0022548 A1 | 1/2014 | Lee et al. |
| 2015/0214261 A1 | 7/2015 | Park et al. |
| 2015/0311239 A1 | 10/2015 | Won et al. |

FOREIGN PATENT DOCUMENTS

| | | | |
|---|---|---|---|
| CN | 103733340 A | 4/2014 | |
| CN | 104142178 A | 11/2014 | |
| CN | 105092028 A | 11/2015 | |
| CN | 105157835 A | 12/2015 | |
| CN | 105509886 A | 4/2016 | |
| CN | 105556944 A | 5/2016 | |
| JP | 2008-191144 * | 8/2008 | ............. G01J 3/447 |
| JP | 2008-191144 A | 8/2008 | |
| JP | 2012-143348 A | 8/2012 | |
| JP | 2015-141106 A | 8/2015 | |
| KR | 10-0853196 * | 8/2008 | ........... H01L 27/146 |
| KR | 10-0853196 B1 | 8/2008 | |
| KR | 10-2009-0033725 A | 4/2009 | |
| KR | 10-2010-0055723 A | 5/2010 | |
| KR | 10-2011-0130341 A | 12/2011 | |
| KR | 10-2014-0072407 A | 6/2014 | |
| KR | 20150067141 A | 6/2015 | |
| KR | 10-2016-0024608 A | 3/2016 | |
| KR | 2016-0098456 A | 8/2016 | |
| KR | 2016-0106416 A | 9/2016 | |
| KR | 2016-0106422 A | 9/2016 | |
| KR | 2016-0110789 A | 9/2016 | |
| KR | 2016-0110799 A | 9/2016 | |

OTHER PUBLICATIONS

Written Opinion of the International Searching Authority PCT/ISA/237 for International Application No. PCT/KR2017/008258 dated Dec. 4, 2017.

* cited by examiner

Band-Limited Filter Wavelength Band

Spectral Filter Operating Wavelength Band

Band-Limited Filter Wavelength Band

Spectral Filter Operating Wavelength Band

FIG. 7

$$\boxed{F_1\ \cdot\ \cdot\ \cdot\ \cdot\ F_M}$$

⇩

$$\begin{bmatrix} F_1(\lambda_1) & \cdots & F_1(\lambda_N) \\ \vdots & \vdots & \vdots \\ F_i(\lambda_1) & \cdots & F_i(\lambda_N) \\ \vdots & \vdots & \vdots \\ F_M(\lambda_1) & \cdots & F_M(\lambda_N) \end{bmatrix}$$

⇩

$$\begin{bmatrix} r_1 \\ \vdots \\ r_i \\ \vdots \\ r_M \end{bmatrix} = \begin{bmatrix} F_1(\lambda_1) & \cdots & F_1(\lambda_N) \\ \vdots & \vdots & \vdots \\ F_i(\lambda_1) & \cdots & F_i(\lambda_N) \\ \vdots & \vdots & \vdots \\ F_M(\lambda_1) & \cdots & F_M(\lambda_N) \end{bmatrix} \begin{bmatrix} s(\lambda_1) \\ s(\lambda_2) \\ \vdots \\ \vdots \\ s(\lambda_N) \end{bmatrix}$$

$$
\begin{bmatrix}
B_1(\lambda_1)F_1(\lambda_1) & \cdots & B_1(\lambda_N)F_1(\lambda_N) \\
B_1(\lambda_1)F_i(\lambda_1) & \cdots & B_1(\lambda_N)F_i(\lambda_N) \\
\vdots & \cdots & \vdots \\
B_1(\lambda_1)F_M(\lambda_1) & \cdots & B_1(\lambda_N)F_M(\lambda_N)
\end{bmatrix}
\begin{bmatrix}
B_2(\lambda_1)F_1(\lambda_1) & \cdots & B_2(\lambda_N)F_1(\lambda_N) \\
B_2(\lambda_1)F_i(\lambda_1) & \cdots & B_2(\lambda_N)F_i(\lambda_N) \\
\vdots & \cdots & \vdots \\
B_2(\lambda_1)F_M(\lambda_1) & \cdots & B_2(\lambda_N)F_M(\lambda_N)
\end{bmatrix}
\begin{bmatrix}
B_3(\lambda_1)F_1(\lambda_1) & \cdots & B_3(\lambda_N)F_1(\lambda_N) \\
B_3(\lambda_1)F_i(\lambda_1) & \cdots & B_3(\lambda_N)F_i(\lambda_N) \\
\vdots & \cdots & \vdots \\
B_3(\lambda_1)F_M(\lambda_1) & \cdots & B_3(\lambda_N)F_M(\lambda_N)
\end{bmatrix}
$$

$$
\begin{bmatrix} r_1 \\ \vdots \\ r_i \\ \vdots \\ r_M \end{bmatrix} = 
\begin{bmatrix}
B_1(\lambda_1)F_1(\lambda_1) & \cdots & B_1(\lambda_N)F_1(\lambda_N) & B_2(\lambda_1)F_1(\lambda_1) & \cdots & B_2(\lambda_N)F_1(\lambda_N) & B_3(\lambda_1)F_1(\lambda_1) & \cdots & B_3(\lambda_N)F_1(\lambda_N) \\
\vdots & & \vdots & \vdots & & \vdots & \vdots & & \vdots \\
B_1(\lambda_1)F_M(\lambda_1) & \cdots & B_1(\lambda_N)F_M(\lambda_N) & B_2(\lambda_1)F_M(\lambda_1) & \cdots & B_2(\lambda_N)F_M(\lambda_N) & B_3(\lambda_1)F_M(\lambda_1) & \cdots & B_3(\lambda_N)F_M(\lambda_N) \\
B_2(\lambda_1)F_1(\lambda_1) & \cdots & B_2(\lambda_N)F_1(\lambda_N) & B_3(\lambda_1)F_1(\lambda_1) & \cdots & B_3(\lambda_N)F_1(\lambda_N) & B_2(\lambda_1)F_1(\lambda_1) & \cdots & B_2(\lambda_N)F_1(\lambda_N) \\
\vdots & & \vdots & \vdots & & \vdots & \vdots & & \vdots \\
B_2(\lambda_1)F_M(\lambda_1) & \cdots & B_2(\lambda_N)F_M(\lambda_N) & B_3(\lambda_1)F_M(\lambda_1) & \cdots & B_3(\lambda_N)F_M(\lambda_N) & B_2(\lambda_1)F_M(\lambda_1) & \cdots & B_2(\lambda_N)F_M(\lambda_N) \\
B_3(\lambda_1)F_1(\lambda_1) & \cdots & B_3(\lambda_N)F_1(\lambda_N) & & & & & & \\
\vdots & & \vdots & & & & & & \\
B_3(\lambda_1)F_M(\lambda_1) & \cdots & B_3(\lambda_N)F_M(\lambda_N) & & & & & & 
\end{bmatrix}
\begin{bmatrix} s(\lambda_1) \\ s(\lambda_2) \\ \vdots \\ s(\lambda_N) \end{bmatrix}
$$

$$\begin{array}{|c|c|c|c|c|c|} \hline \multicolumn{6}{|c|}{B_1} \\ \hline F_1 & \cdot & \cdot & \cdot & \cdot & F_M \\ \hline \end{array}$$

⇩

$$\begin{bmatrix} B_1(\lambda_1)F_1(\lambda_1) & \cdots & B_1(\lambda_N)F_1(\lambda_N) \\ \vdots & \vdots & \vdots \\ B_1(\lambda_1)F_i(\lambda_1) & \cdots & B_1(\lambda_N)F_i(\lambda_N) \\ \vdots & \vdots & \vdots \\ B_1(\lambda_1)F_M(\lambda_1) & \cdots & B_1(\lambda_N)F_M(\lambda_N) \end{bmatrix}$$

⇩

$$\begin{bmatrix} 0\cdots 0 & B_1(\lambda_j)F_1(\lambda_j) & B_1(\lambda_{j+1})F_1(\lambda_{j+1}) & \cdots & B_1(\lambda_{j+k})F_1(\lambda_{j+k}) & 0\cdots 0 \\ \vdots & \vdots & \vdots & \vdots & \vdots & \vdots \\ 0\cdots 0 & B_1(\lambda_j)F_i(\lambda_j) & B_1(\lambda_{j+1})F_i(\lambda_{j+1}) & \cdots & B_1(\lambda_{j+k})F_i(\lambda_{j+k}) & 0\cdots 0 \\ \vdots & \vdots & \vdots & \vdots & \vdots & \vdots \\ 0\cdots 0 & B_1(\lambda_j)F_M(\lambda_j) & B_1(\lambda_{j+1})F_M(\lambda_{j+1}) & \cdots & B_1(\lambda_{j+k})F_M(\lambda_{j+k}) & 0\cdots 0 \end{bmatrix}$$

(5)

OPTICAL MODULE AND OPTICAL DEVICE USING SAME

CROSS-REFERENCE TO RELATED APPLICATIONS

This application is a national phase under 35 U.S.C. § 371 of PCT International Application No. PCT/KR2017/008258 which has an International filing date of Jul. 31, 2017, which claims priority to Korean Application Nos. 10-2016-0110799, filed Aug. 30, 2016, and 10-2017-0053895, filed Apr. 26, 2017, the entire contents of each of which are hereby incorporated by reference.

TECHNICAL FIELD

The present disclosure relates to a filter array type spectrometer, and more particularly, to an optical module including a band-limiting filter in a spectral filter for signal restoration and resolution enhancement in object spectrum restoration, and an optical device using the optical module.

BACKGROUND ART

Spectroscopic instruments, which analyze the intrinsic optical spectrum of a material, are widely used to measure color or molecular bonding of objects in a wideband wavelength range from visible light to infrared band. Conventionally, it has been utilized as a bench top type organic/inorganic substance analyzing instrument such as a UV-VIS-NIR spectrophotometer and a Fourier transform infrared (FTIR) spectroscopic instrument. However, as attentions are gradually paid to various application fields such as food fields (for example, environmental harmful factor detection, water quality inspection, process control through monitoring of industrial and agricultural process lines, detection of residual pesticides, proof of origin, oil oxidation degree measurement, and the like) and medical bio fields, the demand for development of miniaturized devices for field measurement is increasing. In addition, in recent years, due to an increasing demand for self-management of health, food, and environment, it is also expected to be applied as personal portable spectroscopic instruments and Internet of Things spectroscopic sensors based on ultra miniaturization.

As the most effective way to miniaturize spectroscopy instruments, there has been proposed a method in which an optical component for dispersing light is manufactured in the form of an array of an optical filter having a band filtering function instead of a conventional prism and a diffraction grating and integrated with the optical detector array. The filter array-based spectrometer implementation method is advantageous in that it is robust and easy to miniaturize because it does not require a moving object.

Various types of optical filter structures are proposed as filter arrays for spectrometer, and among them, there is a linear variable filter (LVF). The LVF is an optical filter having a Fabry-Perot resonator structure, and has a structure in which the thickness of a dielectric resonance layer located between upper and lower mirror layers in the length direction varies linearly in the length direction.

Due to a linear structure whose thickness varies in the length direction, Such an LVF has a limitation in process reproducibility and productivity, and has a disadvantage in that process compatibility with the two-dimensional imaging sensor technology is also insufficient. Since the resolution of a spectrometer is also determined by the height-to-length ratio of the LVF, there are restrictions on downsizing a spectrometer element.

To overcome this issue, a plasmonics-based filter technique having excellent resonance spectrum wavelength variability is proposed. For example, a transmission filter using an extraordinary optical transmission (EOT) phenomenon occurring in a nanohole array structure periodically arranged on a metal thin film structure is used. Since the broadband variability of the resonance wavelength is possible only by the two-dimensional horizontal structure control without the vertical structure modification, it is possible to form a highly integrated spectral filter array even with a simple process, and is advantageous for integration with a two-dimensional image device and mass production.

On the other hand, since the resolution of a filter array-based spectrometer increases in proportion to the number of filters, a large number of filters are required for high resolution. However, since there are limitations in the process technology that finely and individually controls the interval between the center wavelengths without overlapping of spectrums between the individual filters, the substantially implementable resolutions are limited. The limitation of the number of filters also affects the digital signal processing process for object spectrum restoration, so that is serves as a factor for degrading signal restoration capability and operation stability.

DISCLOSURE OF THE INVENTION

Technical Problem

The present disclosure provides an optical filter with a miniaturized structure.

The present disclosure also is to effectively overcome the limitation of the number of filters in a filter array-based spectrometer and to improve the signal restoration capability and resolution of the spectrometer.

The present disclosure also is to provide a convenient additional means of improving the resolution of a specific wavelength range through direct application to a filter array type spectrometer.

Technical Solution

Embodiments of the present invention provide an optical module including a spectral filter array including a plurality of unit spectral filters, a band-limited filter configured to selectively transmit light of a wavelength region narrower than a wavelength region designed to be measured through the spectral filter array, and an optical detection unit configured to detect an optical signal passing through the spectral filter array and the band-limited filter.

A 'band-limited filter' may be understood as a concept of a filter that defines a certain range of wavelength bands. The band-limited filter has a narrower wavelength range than the operating wavelength band designed for the spectral filter. The band-limited filter may physically be configured to cover the whole or a part of the spectral filter. In other words, it is also possible to configure all of the light entering the spectral filter on the optical path to pass through the band-limited filter, and it is also possible that some of the light does not pass through the band-limited filter. It is also possible that a simple optical window is partially added in part.

The spectral filter may be composed of a single or a plurality of unit filter arrays. In the case where a band-limited filter, a spectral filter, and an optical detection unit are provided in different modules, two of them are provided as a module, or all three modules are provided as one module, a band-limited filter may be provided on any of the optical paths before the light incident on the optical detection unit reaches. It should be understood that the scope of the invention encompasses the case where other optical members are interposed between the band-limited filter, the spectral filter, and the optical detection unit. In addition, a band-limited filter may be disposed between the spectral filter and the optical detection unit, and the spectral filter may be disposed between the band-limited filter and the optical detection unit.

In an embodiment, the unit spectral filter may be one of a diffraction grating filter, a prism filter, a Fabry-Perot resonance filter, a plasmonic filter having a metal nanostructure array or a metal nanohole array, a silicon nanowire-based filter, an absorption filter, a resonance waveguide resonance mode type filter, or an optical interference spectral filter using integrated optics.

In an embodiment, the spectral filter array may include a plurality of unit spectral filters in which metal patterns having a predetermined shape are periodically arranged to absorb light or reflect light of a specific wavelength region.

In an embodiment, the band-limited filter may be composed of a plurality of unit band-limited filters for selectively transmitting light of different wavelength regions.

In an embodiment, the band-limited filter may include three to seven unit defining filters, and the optical detection unit may be a CMOS image sensor.

In an embodiment, the unit band-limited filter may include one or a plurality of R, G, and B color filters.

In an embodiment, the one or plurality of unit band-limited filters may selectively transmit light of a certain region within 700 nm to 1100 nm.

In an embodiment, the optical detection unit may be an optical detection pixel of a CMOS image sensor or an infrared image sensor.

In an embodiment, a size of a light detection pixel of the optical detection unit may be smaller than a size of the unit spectral filter.

In an embodiment, the optical module may further include a processing unit configured to perform a function of restoring a spectrum of an incident light using an optical signal detected by the optical detection unit.

In an embodiment, in restoring the spectrum of the light, a filter function matrix may be configured by adding a set of a combination of a spectral filter and a band-limited filter in a column direction.

In an embodiment, in the signal restoration function, a filter function matrix for signal restoration may be such that a range of a wavelength sampling region is effectively limited by a band-limited filter and a matrix value out of an effective wavelength range is converged to zero.

In other embodiments of the present invention, an optical device includes an image sensor region including a color filter layer configured to filter an incident light to at least R, G, and B, and a first light detection region configured to detect an optical signal passing through the color filter layer through a plurality of first unit pixels, and a spectrum sensor region including a spectral filter array configured to measure a spectrum of a target object and a second light detection region configured to detect an optical signal passing through a spectral filter array through a plurality of second unit pixels.

In an embodiment, the optical device may further include a band-limited filter having a wavelength region narrower than an operating wavelength band to be measured through the spectral filter array on a path of an optical signal of the spectrum sensor region.

In an embodiment, the spectral filter array and the band-limited filter may be stacked, and the band-limited filter may be disposed on the spectral filter array.

In an embodiment, the spectral filter array and the band-limited filter may be stacked, and the spectral filter array may be disposed on the band-limited filter.

In an embodiment, the band-limited filter may include a plurality of unit band-limited filters configured to selectively transmit light of different wavelength regions.

In an embodiment, the unit-defining filter may include one or a plurality of R, G, and B color filters.

In an embodiment, the one or plurality of unit band-limited filters may selectively transmit light of a certain region within 700 nm to 1100 nm.

In an embodiment, the spectral filter array may include a plurality of unit spectral filters, and each of the unit spectral filters may include periodically arranged metal patterns having a predetermined shape.

In an embodiment, the first light detection region and the second light detection region may include light detection pixels of different sizes.

In an embodiment, the first light detection region and the second light detection region may be part of an optical detector of a CMOS image sensor.

In an embodiment, an analysis wavelength of the spectral filter array of the spectrum sensor region may be in a range of 300 nm to 1100 nm.

In an embodiment, the optical device may further include an additional separation region between the image sensor region and the spectrum sensor region.

Advantageous Effects

According to the present invention, it is possible to effectively overcome the limit of the number of filters in a filter array-based spectrometer and improve the signal restoration capability and resolution of the spectrometer.

The present invention enables only spectral filters to be coupled to a color filter of a conventional silicon CMOS image sensor or to be applied in a corresponding manner.

In addition, the present invention is applied directly to the spectrometer of the prefabricated filter array system to provide a convenient additional means of improving the resolution with respect to the specific wavelength range.

The various filter combinations of the band-limited filters and spectral filters described above may be applied to specific wavelength range Raman spectroscopy instruments or infrared spectroscopy sensor elements.

BRIEF DESCRIPTION OF THE DRAWINGS

FIG. 7 is Equation (3) showing a determinant when the band-pass filter is not inserted.

FIG. 8 is Equation (4) showing a determinant when the spectral filter and the band-pass filter are combined.

FIG. 21 is Equation (5) showing the evolution of the signal restoration determinant when a band-limited filter is coupled to the spectral filter.

MODE FOR CARRYING OUT THE INVENTION

Figure 1:
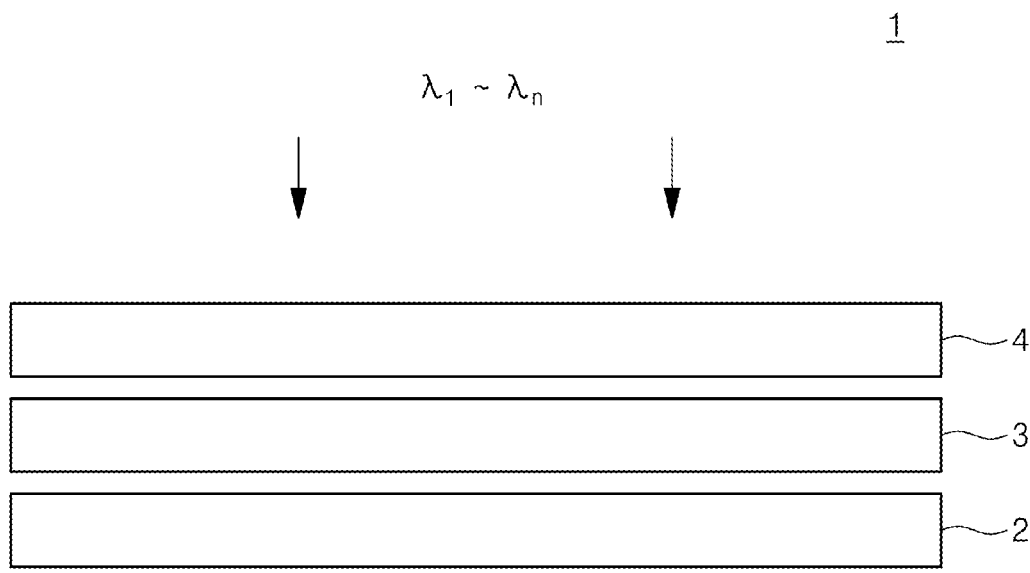
FIGS. 1 and 2 are structural diagrams of an optical device according to the present invention.

Hereinafter, exemplary embodiments disclosed in this specification will be described in detail with reference to the accompanying drawings, and the same or similar elements are designated with the same numeral references regardless of the numerals in the drawings and their redundant description will be omitted. The suffixes "module" and "unit" for elements used in the following description are given or used interchangeably only for facilitation of preparing this specification, and thus they are not granted a specific meaning or function. In describing exemplary embodiments disclosed in this specification, a specific description for publicly known technologies to which the invention pertains will be omitted when the description is judged to obscure the gist of the embodiments disclosed in the specification. Also, it should be understood that the accompanying drawings are merely illustrated to easily explain exemplary embodiments disclosed in this specification, and therefore, they should not be construed to limit the technical idea disclosed in this specification but be construed to cover all modifications and alternatives falling within the spirit and scope of the present invention.

Figure 2:
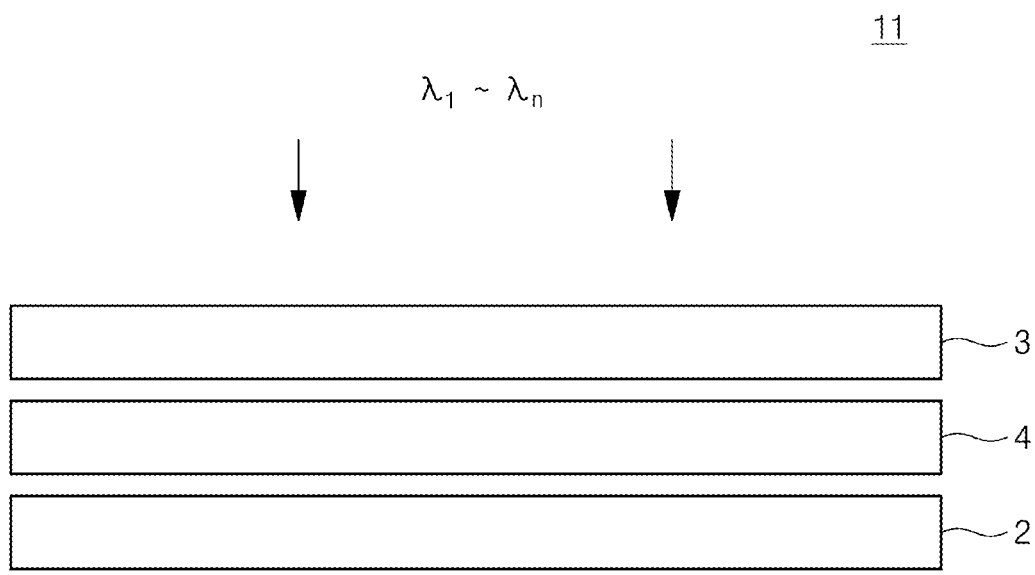

FIGS. 1 and 2 are structural diagrams of an optical device according to the present invention.

The optical device 1 or 11 according to the embodiment of the present invention includes a spectral filter 3 and an optical detection unit 2 for detecting light passing through the spectral filter 3 and further includes a band-limited filter 4.

The spectral filter 3 may include a single or a plurality of unit filters, and may allow a certain wavelength to pass through. The optical detection unit 2 performs a function of detecting light passing through the spectral filter 3 and performs generally known functions such as changing the amount of light detected through various electric circuit parts, electrodes, etc. to electrical signals. The optical detection unit 2 may include a single or a plurality of unit optical detectors.

On the other hand, the spectral filter 3 and the optical detection unit 2 may be integrated or modularized together, and may be separately formed and disposed as separate modules. In addition, the band-limited filter 4 may also be integrated with the spectral filter 3 and may be placed on the path through which the light is incident to measure the spectrum. That is, the band-limited filter 4, the spectral filter 3, and the optical detection unit 2 are arranged on the optical path for spectrum measurement.

In addition, as shown in FIG. 2, the band-limited filter 4 may be disposed between the spectral filter 3 and the optical detection unit 2. In this case, the spectral filter 3, the band-limited filter 4, and the optical detection unit 2 may be integrated or modularized together, and may be separately formed and disposed as separate modules. In the same manner, the spectral filter 3, the band-limited filter 4, and the optical detection unit 2 are arranged on the optical path for spectrum measurement.

Such an optical filter may improve the signal restoration capability and resolution in the spectrometer. Hereinafter, the band-limited filter 4 will be described in detail later.

Figure 3:
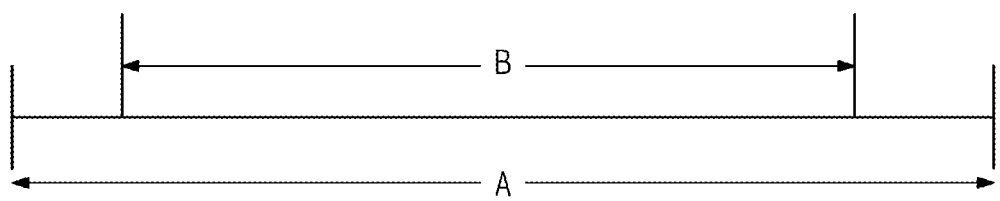
FIGS. 3 and 4 are conceptual diagrams for explaining the function of a band-limited filter according to the present invention.
Figure 4:
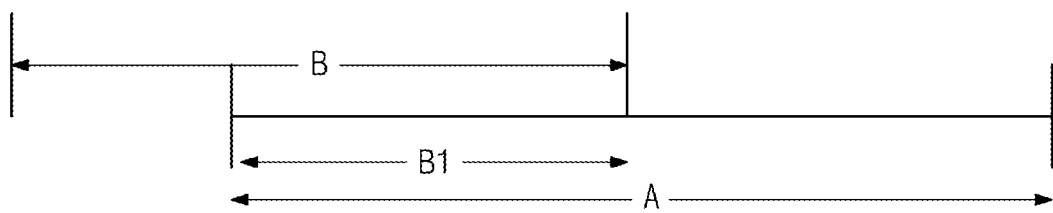

FIGS. 3 and 4 are conceptual diagrams for explaining the function of a band-limited filter according to the present invention.

Referring to FIG. 3, one of the main features of the band-limited filter 4 has a wavelength region B narrower than an operating wavelength band A to be measured in the spectral filter 3. With such a function, the band-limited filter 4 may include a single filter or may include a plurality of stacked filters. A plurality of filters may be disposed on the optical path to perform the above-described functions. This is included in the concept of the band-limited filter 4. Physically, it is not limited to specific modes such as various band-limited filters 4 and RGB color filters.

On the other hand, the fact that the wavelength band of the band-limited filter 4 is smaller than the designed operating wavelength band of the spectral filter means that only the wavelength band of the band-limited filter 2 is small within the wavelength band A to be measured by the spectral filter 3. Therefore, if the wavelength band of the band-limited filter 2 has a region outside the designed operating wavelength band of the spectral filter 3, this is not included. That is, among the wavelength bands of the band-limited filter 4, only B1 corresponding to the designed operating wavelength band of the spectral filter 3 is calculated, and as a result, the condition of the band-limited filter 4 is satisfied when A>B1.

On the other hand, all the light passing through the band-limited filter 4 may be incident toward the spectral filter 3, and if necessary, only a part of light passing through the band-limited filter 4 may be incident to the spectral filter 3.

On the other hand, in the present invention, the spectral filter 3 used in combination with the band-limited filter 4 may be applied without discriminating between the transmission mode and the reflection mode. And, it may be used without discrimination such as diffraction grating type, prism type, Fabry-Perot type resonance filter, plasmonic filter, absorption type filter, semiconductor quantum dot filter, resonance waveguide resonance mode type filter, and optical interference type spectral filter using integrated optical.

Moreover, in actual implementation, the band-limited filter may be a band that is smaller than the entire operating wavelength range of the spectral filter, or may form one or more nodes (minimum intensity points) in the middle band. For example, a double-peaked band-limited filter may perform mathematically similar functions. In addition, ripples or side lobes may exist in the out-of-band region even with a single transmission band filter, and this case may be mathematically processed.

Embodiment 1

Figure 5:
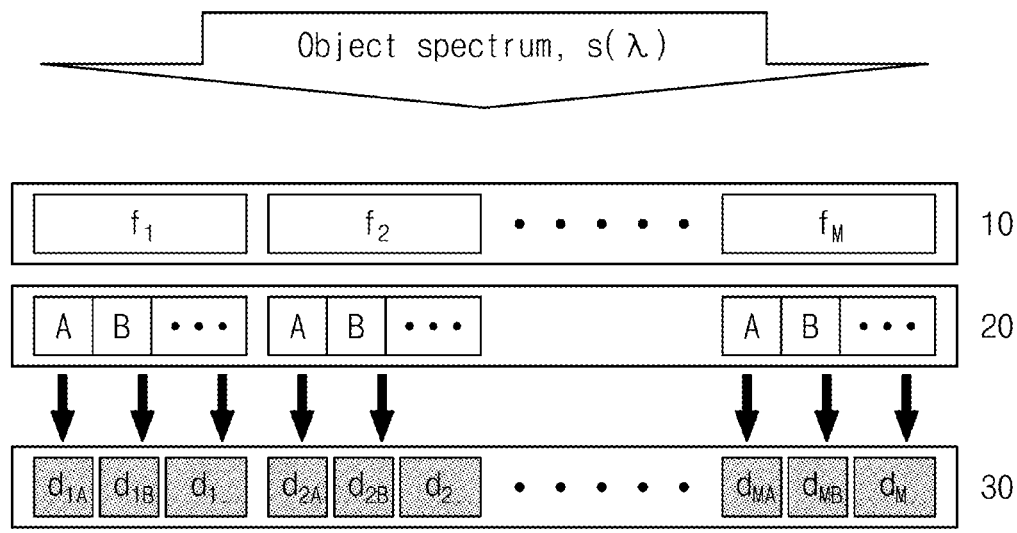
FIG. 5 is a conceptual diagram of an optical device according to Embodiment 1 of the present invention.
Figure 6:
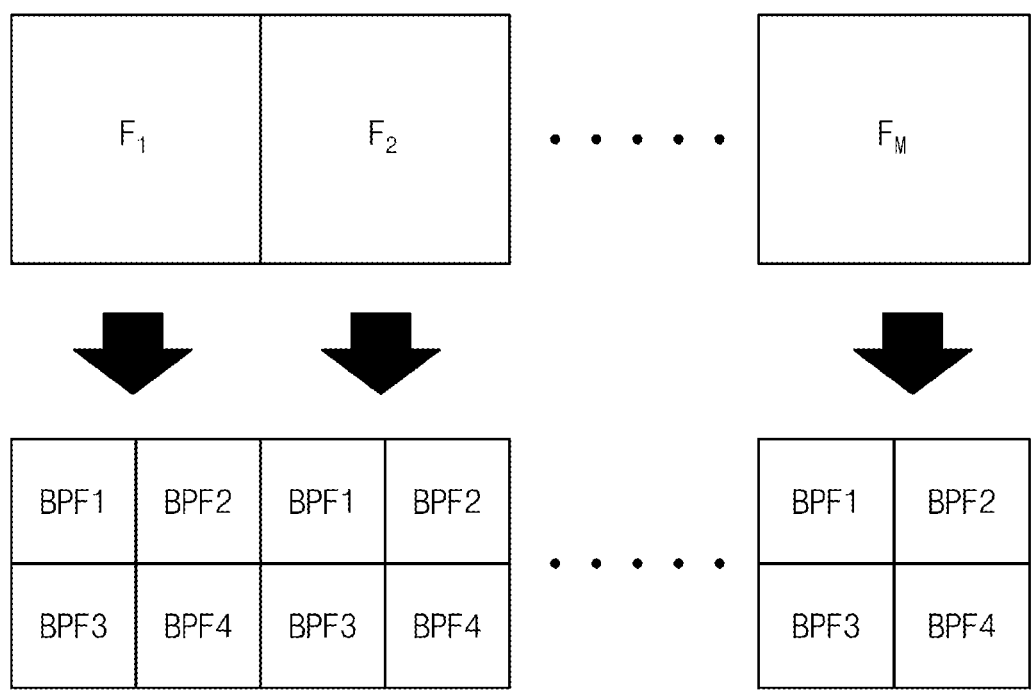
FIG. 6 is a conceptual diagram of a combination structure of a spectral filter and a band-limited filter in an optical device.

FIG. 5 is a conceptual diagram of an optical device according to Embodiment 1 of the present invention, and FIG. 6 is a conceptual diagram of a combination structure of a spectral filter and a band-limited filter in an optical device. FIG. 7 is Equation (3) showing a determinant when the band-pass filter is not inserted. FIG. 8 is Equation (4) showing a determinant when the spectral filter and the band-pass filter are combined.

The optical device includes a spectral filter 10, an optical detection unit 30 for detecting light passing through the spectral filter 10, and a band-limited filter 20. The band-limited filter 20 has a wavelength region B smaller than the wavelength band A designed to be measured by the spectral filter 10 as described above.

Referring to FIG. 6, in the arrangement structure of the band-limited filters 20 corresponding to the unit spectral filters F1, F2, F3 . . . of the spectral filter, a plurality of band-limited filter sets BPF1, BPF2, BPF3, and BPF4 correspond to a unit spectral filter. However, the present invention is not limited thereto and various modifications are possible. That is, unit band-limited filters per unit spectral filter F1, F2, . . . are possible without limitation, such as 1, 2, 3, 4, or more.

At least one band-limited filter corresponding to each unit spectral filter is possible, and if a plurality is provided, it is also possible to replace one of the sets with a general optical window layer having no filtering function.

However, if two or more unit band-limited filters correspond to each one unit spectral filter F1, F2, . . . , the number of effective filters is increased in combination with band-limited filters without increasing the number of unit spectral filters.

Further, according to this embodiment, there is an effect that the signal restoration capability and resolution are improved and the burden of the filter array process is remarkably alleviated.

A band-limited filter set may be designed with multiple filters to define a specific wavelength band or cover the entire operating wavelength of the spectrometer chip. According to this structure, it is possible to optimize the resolution and the spectrum restoration range of the object.

The band-limited filter may also be an RGB color filter of a CMOS image sensor.

Hereinafter, signal processing when a spectral filter and a band-pass filter are combined according to an embodiment of the present invention will be described.

Referring to FIG. 5, when the spectrum of the object to be analyzed is $s(\lambda)$, the transmission function of individual spectral filters is $f_i(\lambda)$, and the sensitivity function of the optical detector is $d_i(\lambda)$, the detection signal $r_i$, which is generated when the spectrum of the object reaches the optical detector through the filter, is expressed by the following relational expression (1), and is expanded into a determinant expressed by the discretized model.

$$r_i = \int_\lambda f_i(\lambda_j) d_i(\lambda_j) s(\lambda_j) d\lambda_j = \int_\lambda D_i(\lambda_j) s(\lambda_j) d\lambda_j \quad (1)$$

$$\begin{bmatrix} r_1 \\ \vdots \\ r_i \\ \vdots \\ r_M \end{bmatrix} = \begin{bmatrix} D_1(\lambda_1) & \ldots & D_1(\lambda_N) \\ \vdots & \vdots & \vdots \\ D_i(\lambda_1) & \ldots & D_i(\lambda_N) \\ \vdots & \vdots & \vdots \\ D_M(\lambda_1) & \ldots & D_M(\lambda_N) \end{bmatrix} \begin{bmatrix} s(\lambda_1) \\ s(\lambda_2) \\ \vdots \\ \vdots \\ s(\lambda_N) \end{bmatrix} + \begin{bmatrix} n_1 \\ n_2 \\ \vdots \\ \vdots \\ n_M \end{bmatrix} \quad (2)$$

Under this background, the case where the band-limited filter is not inserted and the case where the band-limited filter is inserted are compared.

First, according to the prior art, FIG. 7 is Equation (3) showing a determinant when the band-pass filter is not inserted. Here, the detector sensitivity index is assumed to be 1 regardless of wavelength, and M denotes the number of filters. In this case, since there is a process limitation in increasing the number of filters by a certain number or more, an ill-posed problem occurs in which the number M of filters is smaller than the number N of wavelength samples. This results in an under-determined problem in which the equation is less than unknowns in the matrix equation. As the degree becomes worse, performance deterioration occurs in the signal restoration reliability and resolution even if the solution is applied by regularization.

Second, FIG. 8 is Equation (4) showing a determinant when the spectral filter and the band-pass filter are combined. The band-pass filter is shown as an example when implemented in three sets. By the combining of the individual spectral filter function $f_i(\lambda)$ and the band-pass filter function $B_i(\lambda)$, as individual band transmission filters the effective filter function $B_i(\lambda)f_i(\lambda)$ is defined. Accordingly, three sets of the effective filter functions independent of each other are derived. When these three sets of the effective filter functions are sequentially added, shown in equation (4), the digital signal restoration algebraic matrix equation, an effect of increasing the number of effective filters by the combined multiple is obtained. As a result, by tall metrixing a wide matrix under under-determined condition, it is possible to bring the effect of improving the signal restoration reliability and resolution using the least squares method and regularization technique.

Embodiment 2

Figure 9:
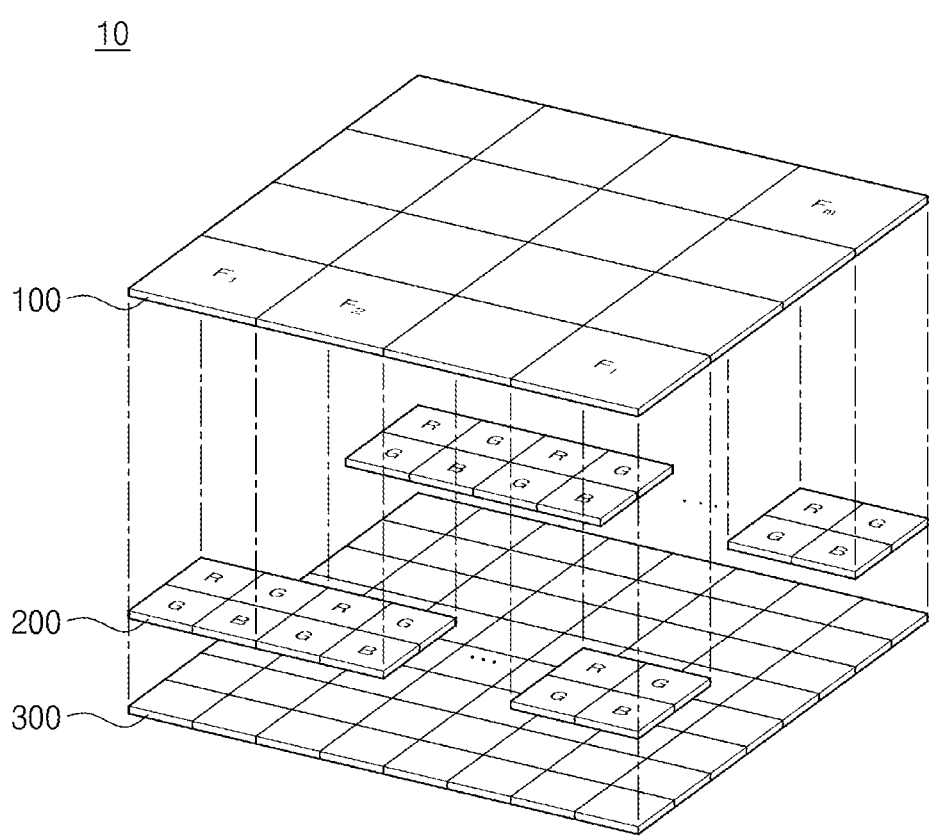
FIG. 9 is a perspective view of an optical device showing a configuration in which a band-limited filter used as a band-limited filter in the structure of Embodiment 1 is replaced with an RGB color filter of a silicon CMOS image sensor according to Embodiment 2 of the present invention.
Figure 10:
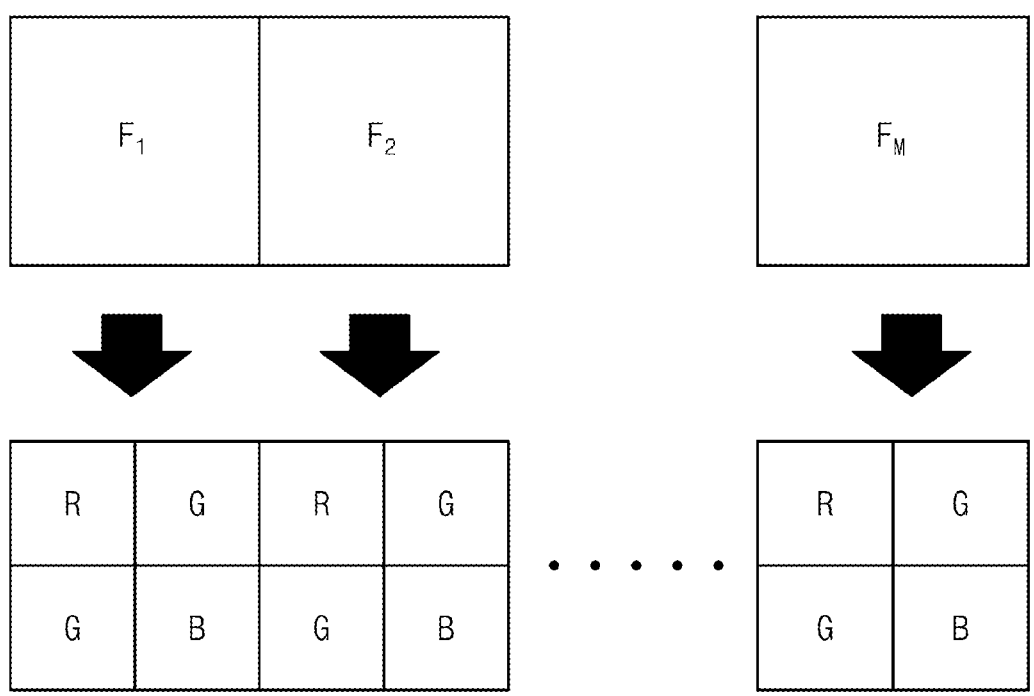
FIG. 10 is a conceptual diagram showing that four unit RGB color filters for one unit spectral filter are corresponded.

FIG. 9 is a perspective view of an optical device showing a configuration in which a band-limited filter used as a band-limited filter in the structure of Embodiment 1 is replaced with an RGB color filter of a silicon CMOS image sensor according to Embodiment 2 of the present invention. FIG. 10 is a conceptual diagram showing that four unit RGB color filters for one unit spectral filter are corresponded.

An advantage of this embodiment is that it is possible to easily construct a structure for coupling a spectral filter array thereon without removing the color filter of a commercially available silicon CMOS image sensor. In this case, the color filter 200 of the CMOS image sensor performs a function similar to the band-limited filter described above. That is, the color filter 200 has a wavelength region B that is smaller than the wavelength band A to be measured in the spectral filter 100.

On the other hand, according to this embodiment, four unit color filters are shown to correspond to one unit spectral filter F1, F2, . . . . However, the present invention is not limited thereto and various modifications are possible. That is, unit color filters per unit spectral filter F1, F2, . . . are possible without limitation, such as 1, 2, 3, 4, or more. However, if two or more unit color filters correspond to each one unit spectral filter F1, F2, . . . , the number of effective filters is increased in combination with color filters without increasing the number of unit spectral filters.

Further, according to this embodiment, there is an effect that the signal restoration capability and resolution are improved and the burden of the filter array process is remarkably alleviated.

Figure 11:
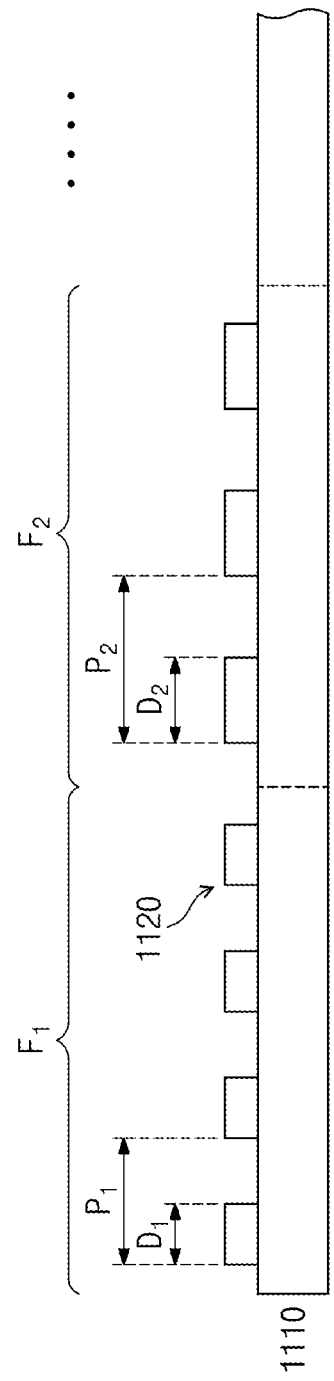
FIGS. 11 and 12 are graphs showing an example of a stop band type plasmonic filter array provided without a color filter and a filter function spectrum thereof.
Figure 12:
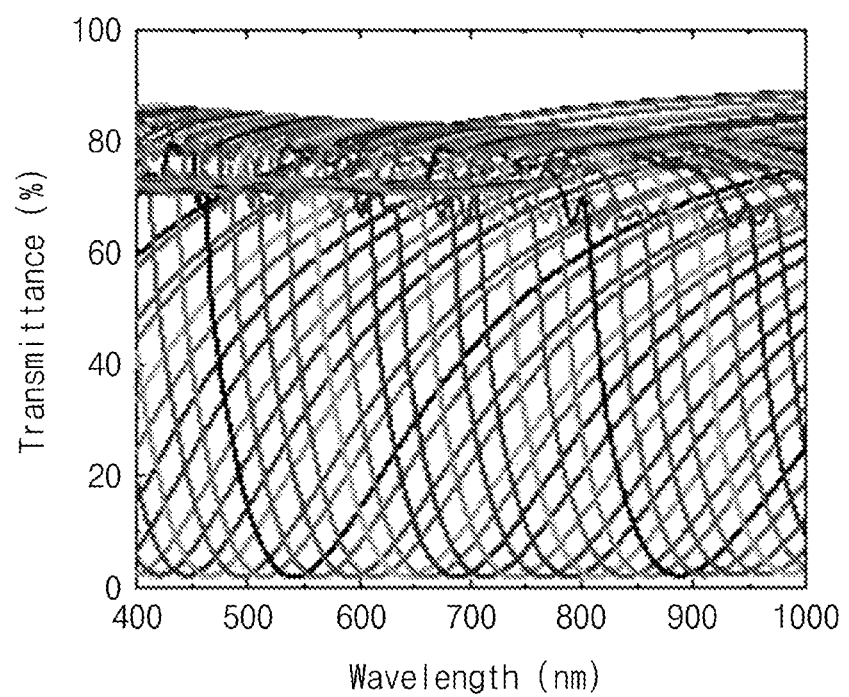

FIG. 11 shows an example of a stop band type plasmonic filter array provided without a color filter, and FIG. 12 shows an example of a graph showing a filter function spectrum of FIG. 11.

Referring to FIG. 11, a spectral filter array according to an embodiment of the present invention includes a plurality of unit spectral filters F1 and F2 on a substrate 1110. The plurality of unit spectral filters F1 and F2 are configured to filter light of different wavelengths. A plurality of unit spectral filters refer to at least two unit spectral filters. A spectrometer according to an embodiment of the present invention includes the spectral filter array, and is configured with an optical detector array including respective light detection regions PD1 and PD2 corresponding to a plurality of unit spectral filters F1 and F2. The unit spectral filters F1 and F2 are filters with stop band characteristics.

The term "stop band characteristic" means that the transmittance according to wavelength has a reverse peak so that unit spectral filters may prevent light of a specific wavelength band from going through. In addition, in another expression, this means that by absorbing light or reflecting light of a specific wavelength band corresponding to the central wavelength for each unit filter, a characteristic of a filter having a transmittance of a reverse peak according to a wavelength to prevent light of a specific wavelength band from going through. For the description of the stop band, the contents of 10-2016-106422 filed by the same applicant are incorporated in the present specification.

The metal patterns 1120 may form an arrangement of metal nanostructures having a periodic lattice structure, and by coupling with localized surface plasmon and lattice mode, show enhanced extraordinary light absorption or light reflection phenomenon in a specific wavelength band. As a result, the spectrum of light transmitted through the array of metal nanostructures forms a dip curve in which transmittance is drastically lowered in a selective wavelength band where specific light absorption or light reflection is enhanced. This serves as a stop band when the transmitted light is used as a reference and the shape of the spectrum depends on the geometric structure such as the selection of the metal material and geometric structure such as periodicity and particle size of nanostructure array. In particular, the central wavelength has a characteristic dominantly determined by the lattice period.

Referring to FIG. 12, the stop band type plasmonic filter array spectrum assumes a 50 nm thick Al nanodisk array having a hexagonal lattice structure, and shows the transmission spectrum calculated by the finite difference time domain method with the lattice period varied from 200 nm to 700 nm at intervals of 10 nm. It may be seen that a single-stop band is formed at regular intervals between 400 nm and 700 nm, which is a usable wavelength range of a typical color CMOS camera.

Figure 13:
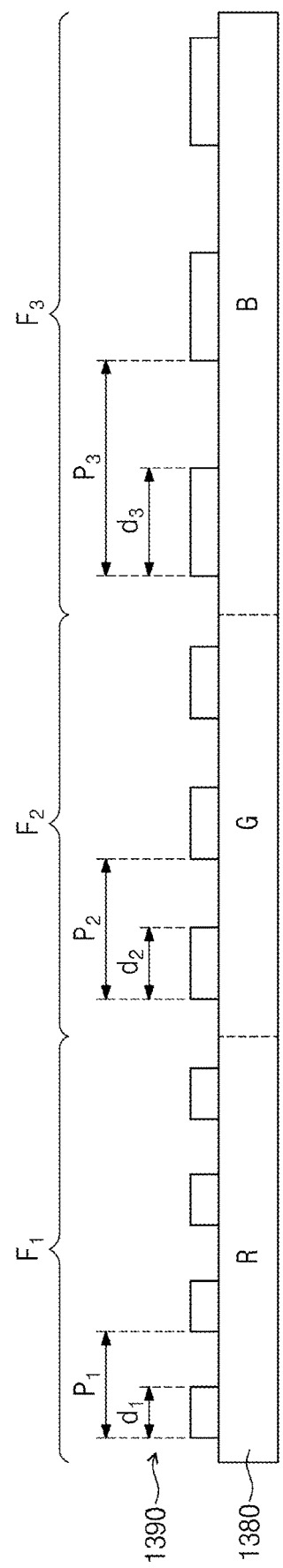
FIGS. 13 and 14 are graphs showing an example of a filter array combined with an RGB color filter, and a spectrum thereof.
Figure 14:
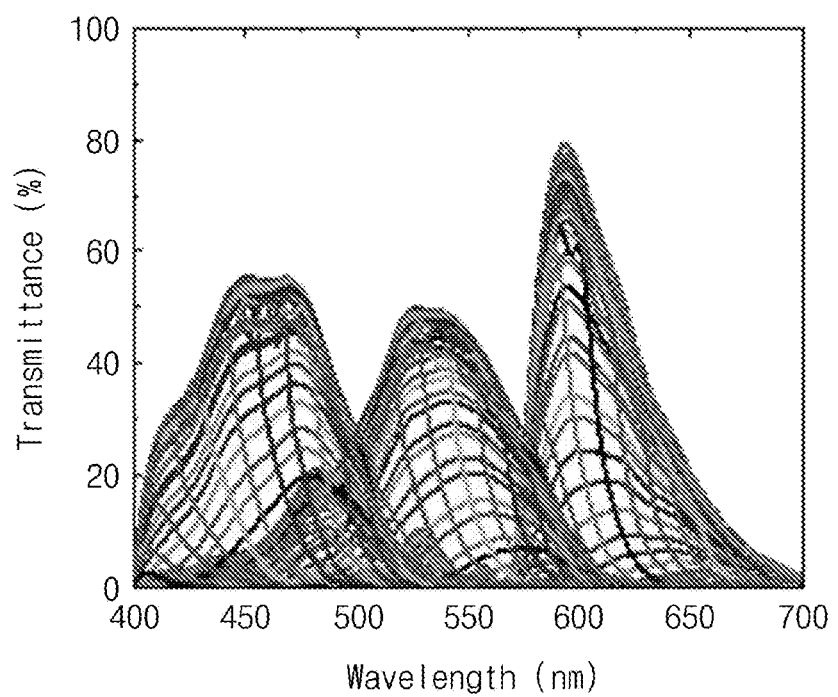

FIG. 13 is an example of a stop band type plasmonic filter array combined with an RGB color filter, and FIG. 14 is a graph showing a spectrum by a filter array combined with the RGB color filter of FIG. 13.

FIG. 13 shows a case where a spectral filter array 1390 is directly formed on color filters R, G, and B 1380.

FIG. 14 shows a transmission spectrum distribution of an effective filter function generated when it is combined with the stop band filter of FIG. 13 by using the individual spectrum of RGB color filters used in actual Si-CMOS color image sensors as band-limited filter functions. It shows the combination of three sets of filter spectra formed as the spectrum of the plasmonic filter array is modified under the influence of the color filter individual function.

Figure 15:
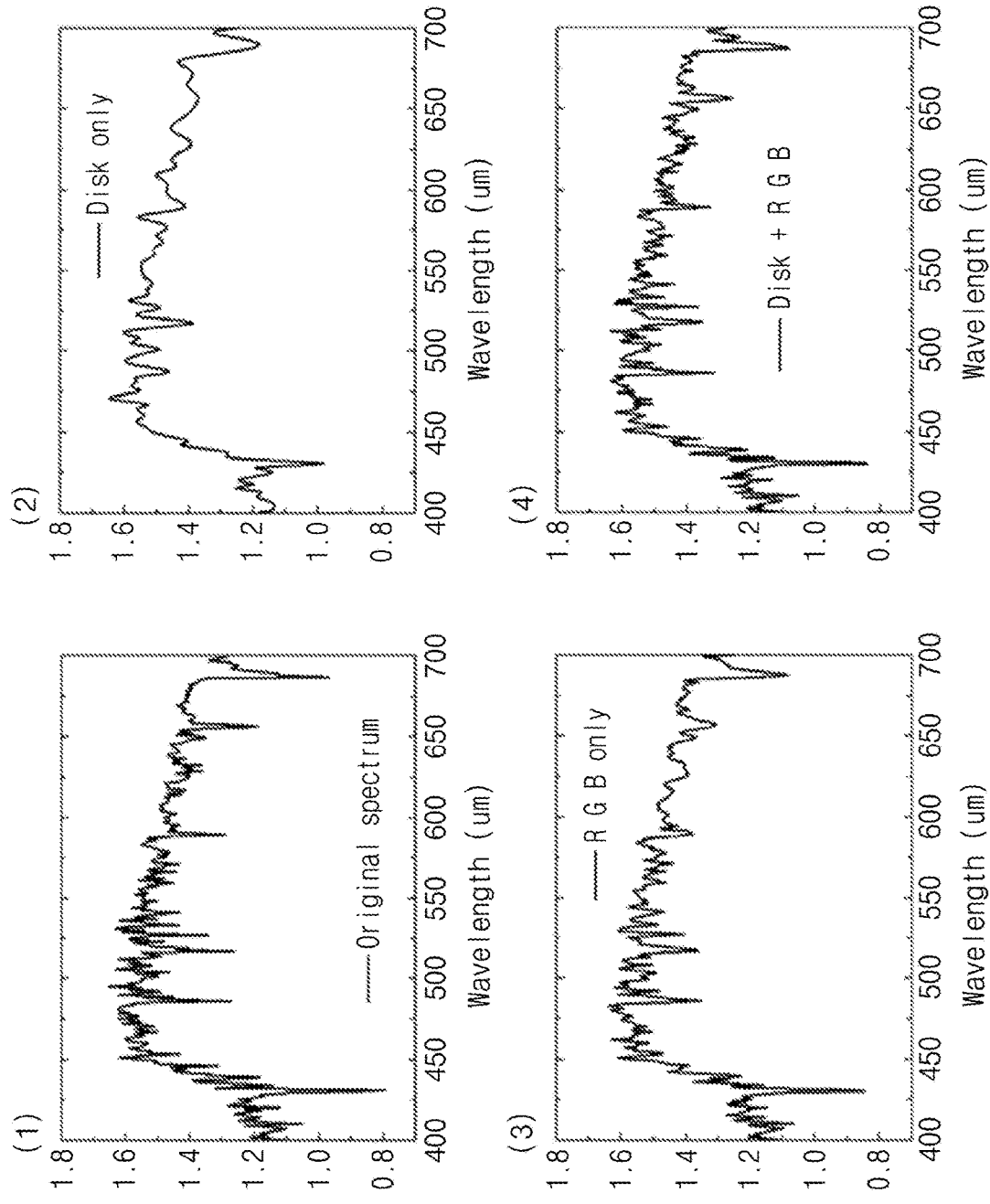
FIG. 15 is a graph for explaining differences in signal restoration depending on the presence or absence of RGB color filters.

FIG. 15 is a graph for explaining difference in signal restoration depending on the presence or absence and combination of a color filter, under the assumption that the object spectrum to be measured is a solar spectrum.

Assuming that a general case where a spectrometer filter is composed only of a stop band type plasmonic filter array, when signal restoration was performed by applying the regularization technique, the overall outline was similar, but the fine intensity distribution change of the original object spectrum was not reproduced. On the other hand, when combined with an RGB color filter, it exhibits a significantly improved spectral reconstruction capability. Also, if a generic optical window filter is additionally configured, i.e., an original stop band filter array function is included to increase the number of filter sets, it may be seen that the signal restoration results are more improved.

Figure 16:
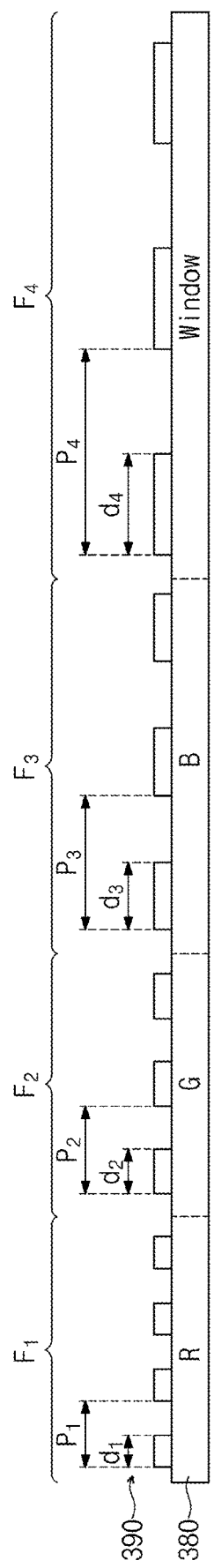
FIGS. 16 and 17 show an example of a filter array and a spectral graph thereof when a general optical window having no filtering function is included as a filter in addition to an RGB color filter.
Figure 17:
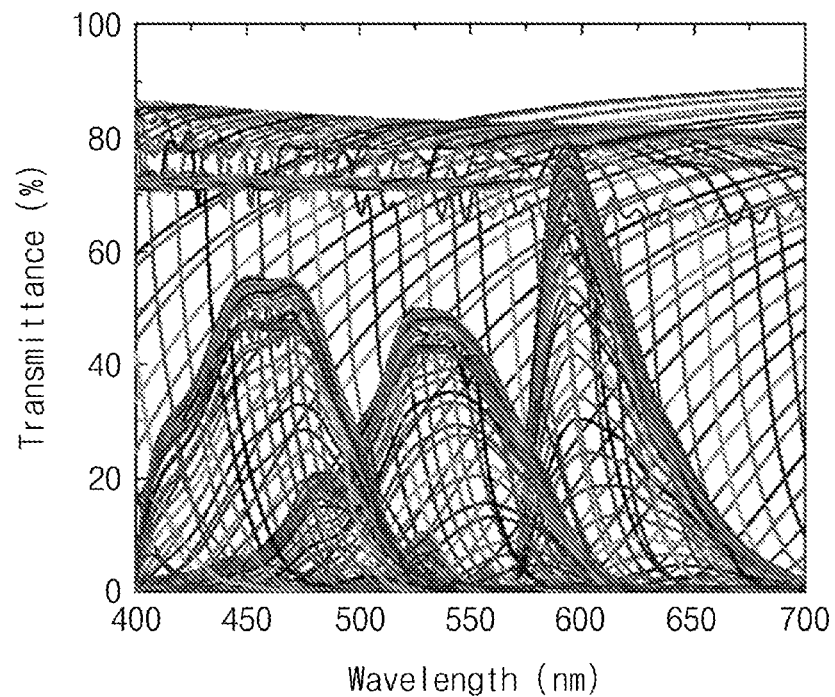

FIG. 16 is an example of a filter array when a general optical window pixel without filtering function is included in addition to the RGB color filter, and FIG. 17 is a graph showing a spectrum by the filter array of FIG. 16.

FIG. 17 shows the spectral distribution assuming that a green (G) color filter is replaced with a general optical window in the RGGB filter configuration of the Bayer pattern commonly used in color CMOS image sensors.

The filter spectrum modified by the RGB band-limited filter and the existing stop-band filter array spectrum are combined to have an effective filter function including a total of four filter sets.

Embodiment 3

Figure 18:
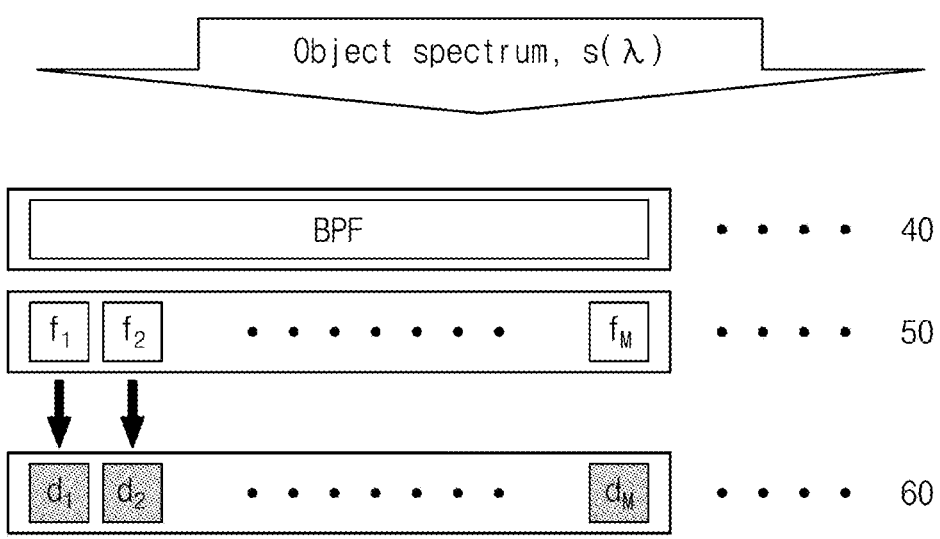
FIG. 18 is a conceptual view for explaining signal processing of the optical device according to the third embodiment of the present invention.
Figure 19:
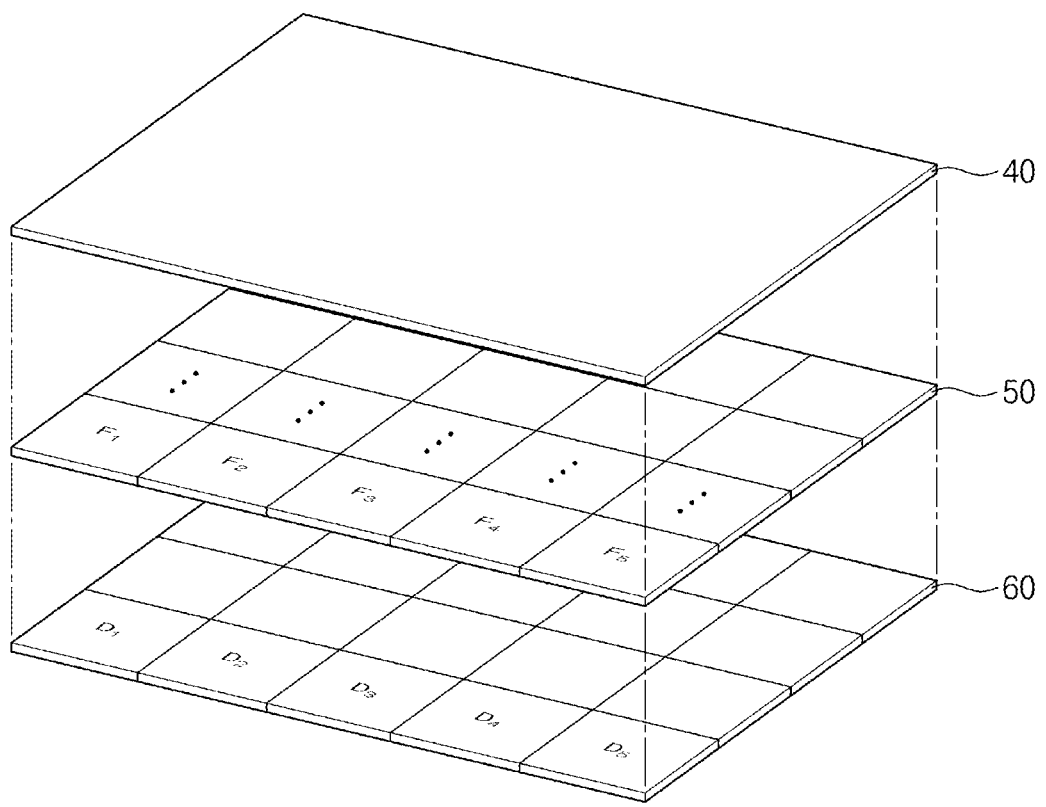
FIG. 19 is a perspective view of the present optical device.
Figure 20:
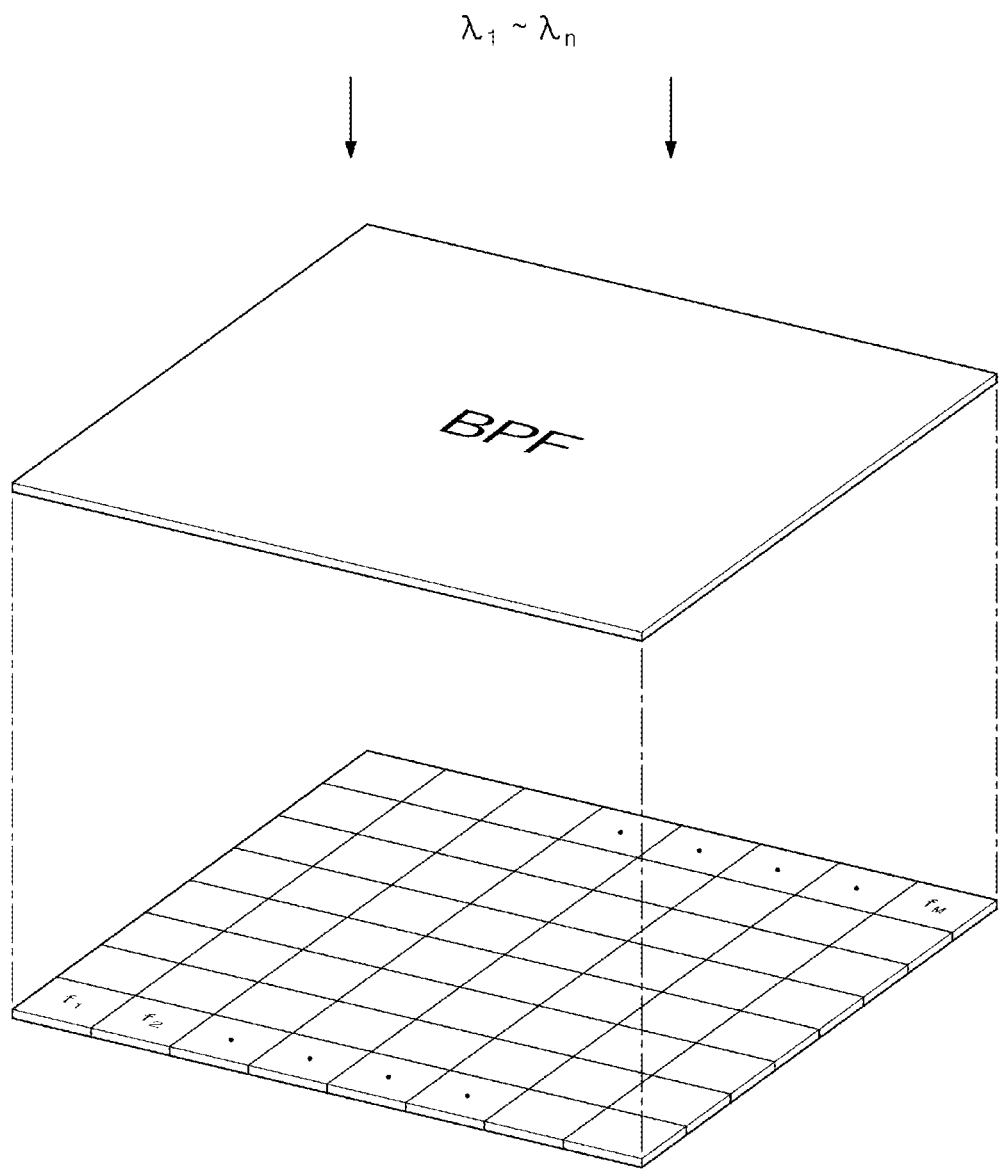
FIG. 20 shows a structure of a spectral filter and a band-limited filter in the present optical device.

FIG. 18 is a conceptual view for explaining signal processing of the optical device according to the third embodiment of the present invention, FIG. 19 is a perspective view of the present optical device, and FIG. 20 shows a structure of a spectral filter and a band-limited filter in the present optical device. FIG. 21 is Equation (5) showing the evolution of the signal restoration determinant when a band-limited filter is coupled to the spectral filter.

The optical device includes a spectral filter 50 consisting of unit spectral filters, an optical detection unit 60 for detecting light passing through the spectral filter, and a band-limited filter 40, which is a band-limited filter.

In relation to the band-limited filter 40, the entire may be formed so as to cover the entire spectral filter as shown in FIGS. 13 and 14, and a plurality of band-pass filters may be arranged as a set. In relation to the band-pass filter set, it is possible that each of the unit band transmission filters transmits the same wavelength band, and that they transmit different wavelength bands.

This structure is advantageous when a separate external band-limited filter is selected according to the application and is manufactured and used in combination with each of components of the spectrometer. FIG. 21 is Equation (5) showing the evolution of the signal restoration determinant when a band-limited filter is coupled to the spectral filter. By limiting some regions of the entire spectrometer operating wavelength range, the number of filters for the spectrometer remains the same and by effectively limiting the range of the wavelength sampling region, the tall functionization of the filter function becomes possible. As a result, signal restoration capability and resolution are improved. That is, the region outside the effective wavelength range $\lambda_j$ to $\lambda_{j+k}$ of the band-limited filter converges to 0, so that the effective signal restoration matrix, which substantially affects the signal restoration process, has a size of M×(K+1). In this case, as the half width of the band-limited filter is smaller, it is expected that the resolution and reliability of the signal restoration is improved.

In actual element operation, the effective wavelength range may be determined in a manner that excludes the signal region exhibiting an intensity distribution of less than or equal to three times the standard deviation s of the measured noise or less than or equal to $1/e^2$ of the maximum transmittance of the band–limited filter.

On the other hand, when combined with a plurality of band-limited filters, a combination filter matrix set may be added in the column direction as shown in Equation (4).

On the other hand, it is possible to assign a high resolution in a specific wavelength range by selectively coupling the filter array type spectrometer element constructed in the previously manufactured module form with the external band transmission filter. Accordingly, it becomes possible to provide various application elements and band filters for each application.

Embodiment 4

Figure 22:
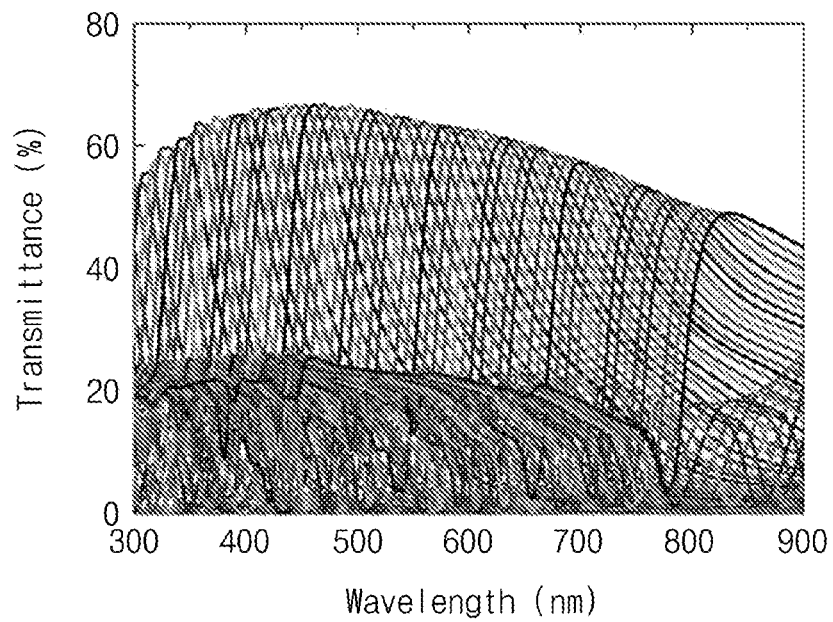
FIGS. 22 to 25 are exemplary calculations showing the effect on signal restoration when a metal nanohole array showing the transmission band of the EOT characteristic according to an embodiment is applied as a spectral filter array and a band-limited filter is further coupled to the upper portion thereof.
Figure 23:
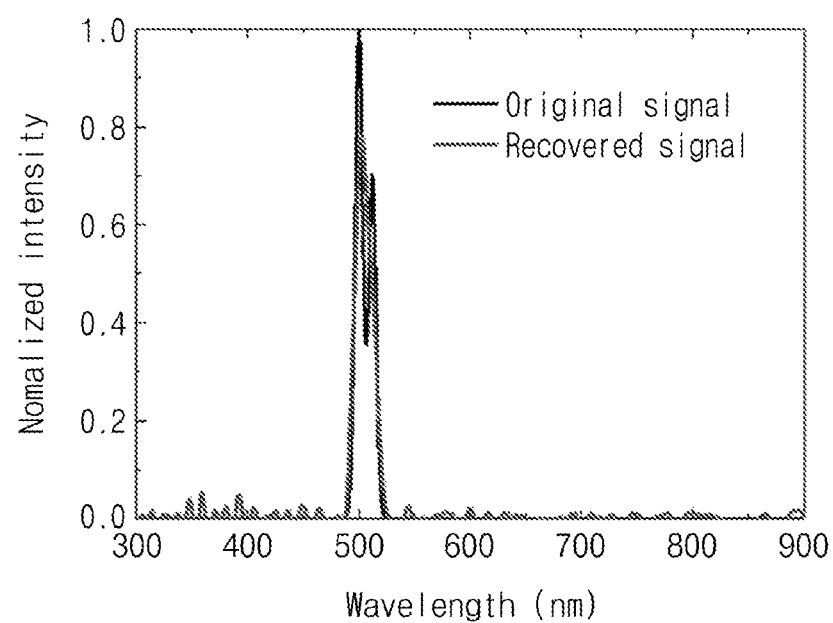

FIGS. 22 and 23 are exemplary calculations showing the effect on signal restoration when a metal nanohole array showing the transmission band of the EOT characteristic according to Embodiment 4 was applied as a spectral filter array and a band-limited filter was further coupled to the upper portion thereof. FIG. 15 is a graph showing the EOT spectrum distribution of a spectral filter array. A nanohole array having a hexagonal lattice structure was formed on an Al metal thin film formed with a thickness of 50 nm on a glass substrate, and with the duty cycle fixed at 50%, the transmission spectrum calculated using the FDTD computer simulation technique is shown for each of the 71 filters manufactured by changing the lattice period from 200 nm to 900 nm at intervals of 10 nm.

FIG. 23 is a graph comparing the restored spectra restored by applying the signal restoration algorithm in the process of restoring the object spectrum using the spectral filter array shown in FIG. 22 with the original spectra. The target spectrum was assumed to be a double peak curve in which two Gaussian peaks with a half width of 8 nm were narrowly overlapped. Here, the distance between the center peaks is 12 nm. It may be seen that the number of the plasmonic filters is not sufficiently large and the half width of the EOT band is wide, so that the double peak is not decomposed.

Figure 24:
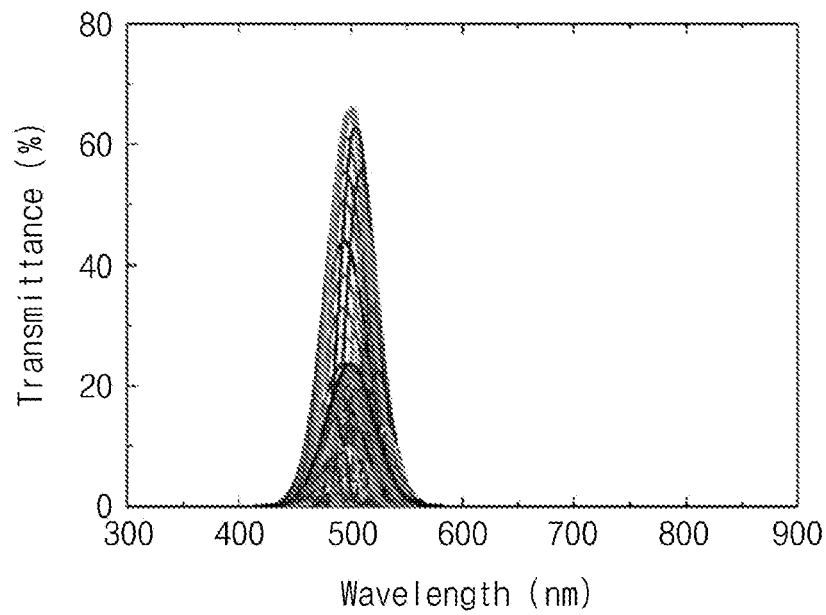

FIG. 24 shows the transmission spectrum of an effective filter function generated when a band-limited filter having a half width of 60 nm with a Gaussian function curve is placed on the plasmonic spectral filter array of FIG. 22 as a band-limited filter. The center wavelength and the half width of the band-limited filter are determined so as to sufficiently include the characteristic shape of the object spectrum to be measured.

Figure 25:
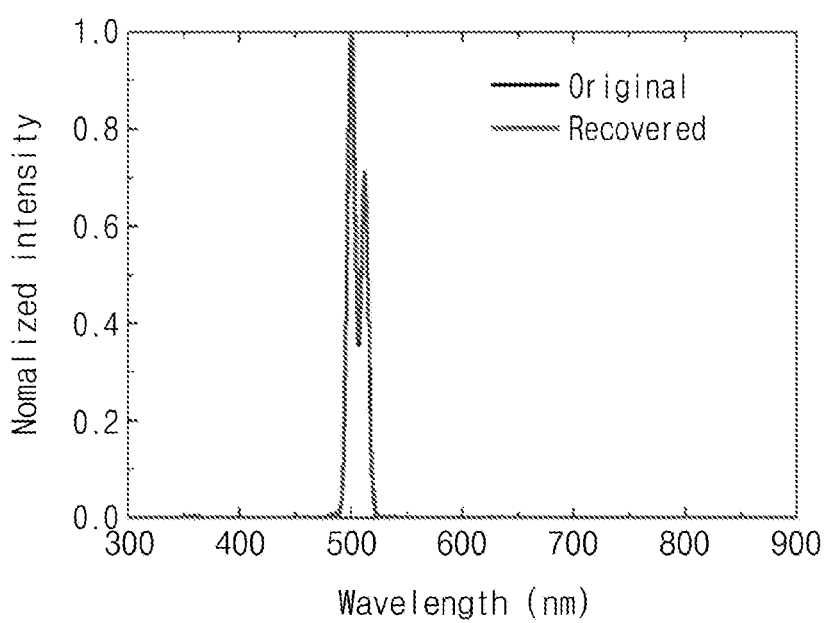

FIG. 25 is a graph comparing the object spectrum restored when a signal restoration algorithm is executed using an effective filter function according to a combination of a band-limited filter and a plasmonic spectral filter array with the original spectrum. It may be confirmed that a high-resolution signal restoration becomes possible very effectively by additionally applying a band-limited filter including a wavelength band to be analyzed to a filter array-based spectrometer. In addition, the stability of the signal restoration process itself is also improved.

In this embodiment, the Gaussian function filter is used as the band-limited filter when classifying the spectrum based on the shape, but various types of filters are available, such as Lorentz function filters, super Gaussian function filters, flat-top rectangular filters, asymmetric transmission filters, and edge filters.

Embodiment 5

Figure 26:
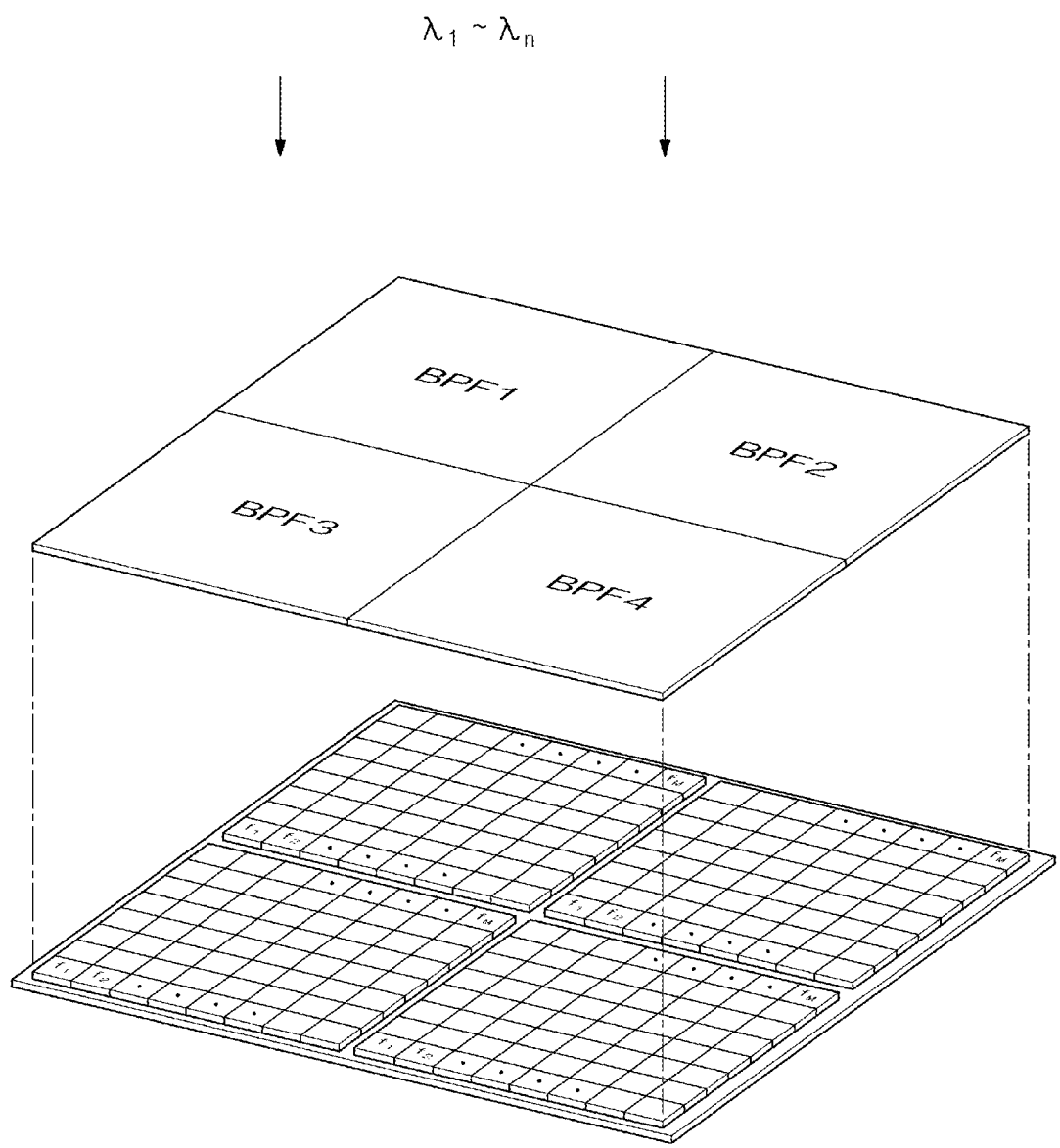
FIG. 26 is a conceptual diagram of a combined structure of a band-limited filter and a spectral filter among the optical devices according to an embodiment of the present invention.

FIG. 26 is a conceptual diagram of a combined structure of a band-limited filter and a spectral filter among the optical devices according to Embodiment 5 of the present invention.

Referring to FIG. 26, there is shown a case where a plurality of band-limited filter sets is used corresponding to individual spectral filter arrays in a state that a plurality of spectral filter arrays for spectrometer operation are provided in multiple sets. That is, it is a structure that combines a band-limited filter set on top of the multi-filter array set integrated in a 2D array optical detector. In this case, one of the band-limited filter sets may be a normal window layer without band filtering function. With this configuration, a high-resolution spectrometer may be operated in multiple wavelength bands. It is also possible to cover the entire operating wavelength of the spectrometer if necessary. This combination results in a similar effect to the coupling structure in which the band-limited filter of Embodiment 1 is located between the spectral filter array and the optical detector. Therefore, it is preferable to select and apply the coupling structure according to the application and process convenience.

Embodiment 6

Figure 27:
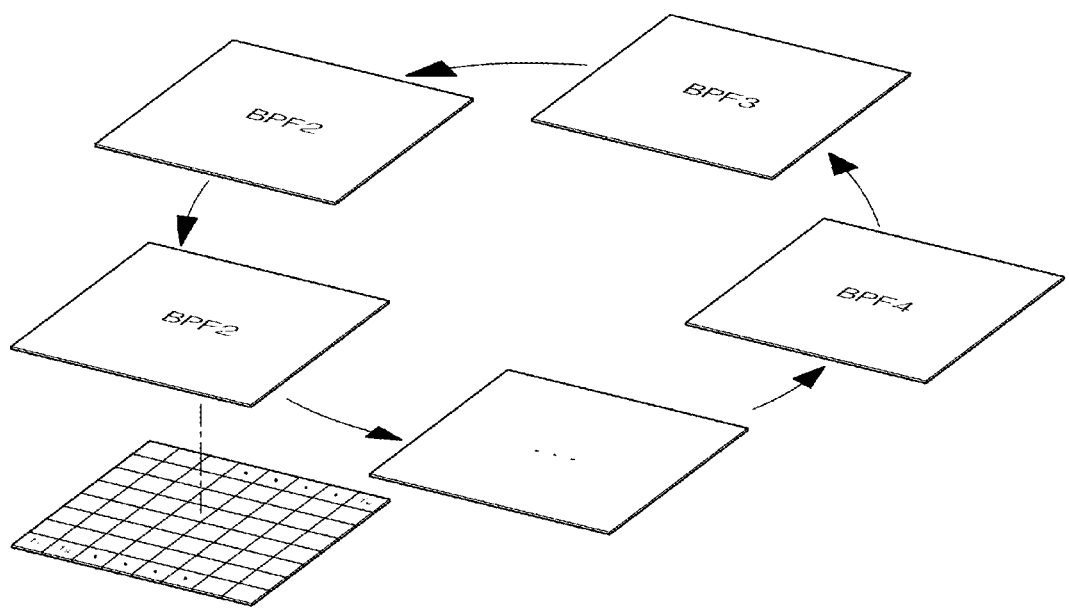
FIG. 27 is a conceptual diagram of a method of selecting a band-limited filter for a multi-wavelength region cover of an optical device according to an embodiment of the present invention.

FIG. 27 is a conceptual diagram of a method of selecting a band-limited filter for a multi-wavelength region cover of an optical device according to Embodiment 6 of the present invention.

Referring to FIG. 27, the difference between the optical device of FIG. 27 and the optical device of FIG. 20 will be mainly described. The optical device of FIG. 27 is a structure in which a plurality of band-limited filters BPF1, BPF2, BPF3, . . . are present and each of them corresponds to a spectral filter. For example, by configuring the plurality of band-limited filters BPF1, BPF2, BPF3, . . . to be rotatable in the form of a wheel, one of the band-limited filters BPF1, BPF2, BPF3, . . . may be selected. With this configuration, there is an effect that multiple wavelength bands for high resolution operation may be selected.

Embodiment 7

Figure 28:
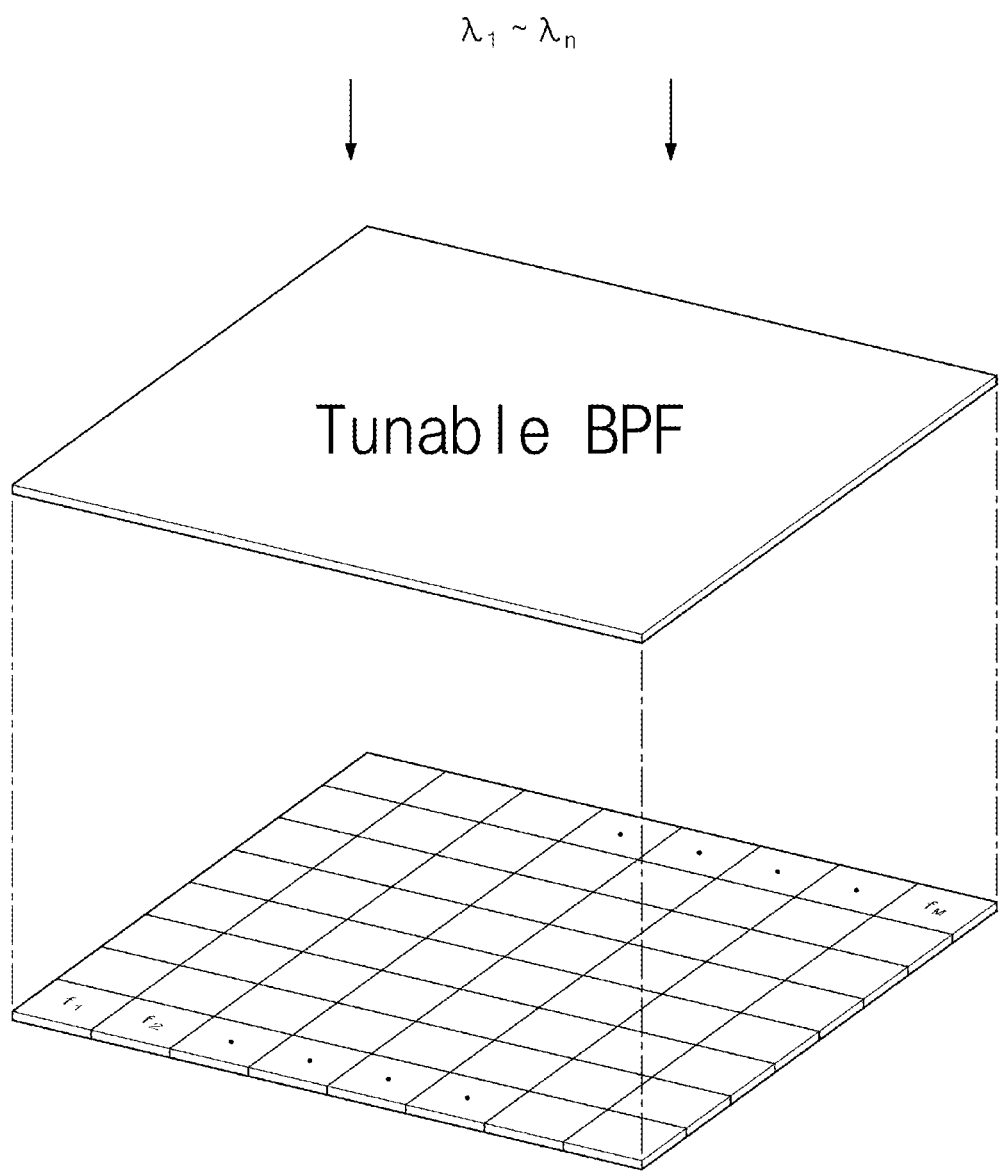
FIG. 28 is a conceptual diagram of a method of applying a band-limited filter available for wavelength tuning in the optical device according an embodiment of the present invention.

FIG. 28 is a conceptual diagram of a method of applying a band-limited filter available for wavelength tuning in the optical device according to Embodiment 7 of the present invention.

Referring to FIG. 28, the difference between the optical device of FIG. 258 and the optical device of FIG. 20 will be mainly described. The optical device of FIG. 28 has a band-limited filter capable of changing the wavelength. This structure is a structure in which a single tunable filter is applied instead of a combination of a multi band filter set to simplify the application element structure.

Examples of band-limited filters with variable wavelengths include liquid crystal variable band-limited filters, and MEMS-based Fabry-Perot type variable band-limited filters.

Embodiment 8

Figure 29:
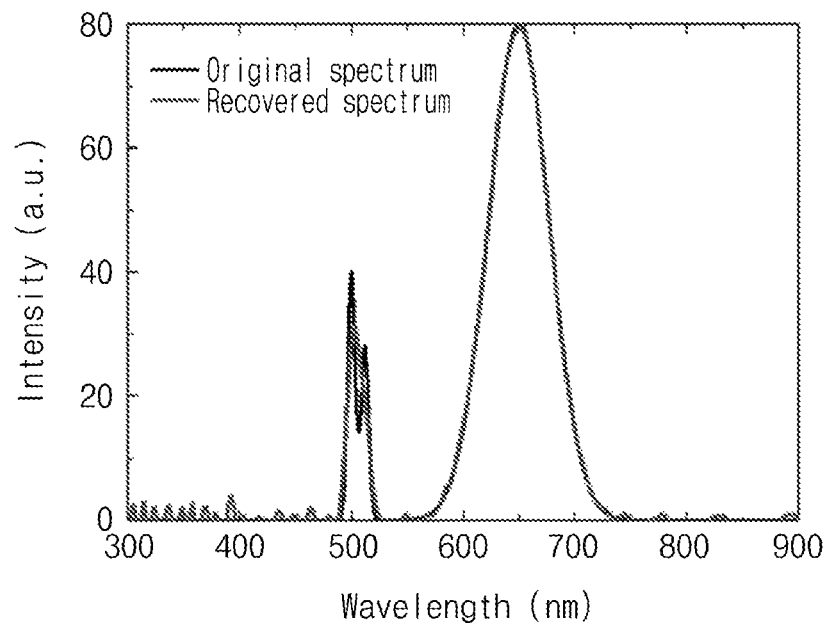
FIGS. 29 to 31 illustrate calculation examples for explaining a method of complementarily using a broadband spectral filter array and a narrowband band-limited filter in an optical device according to an embodiment of the present invention.
Figure 30:
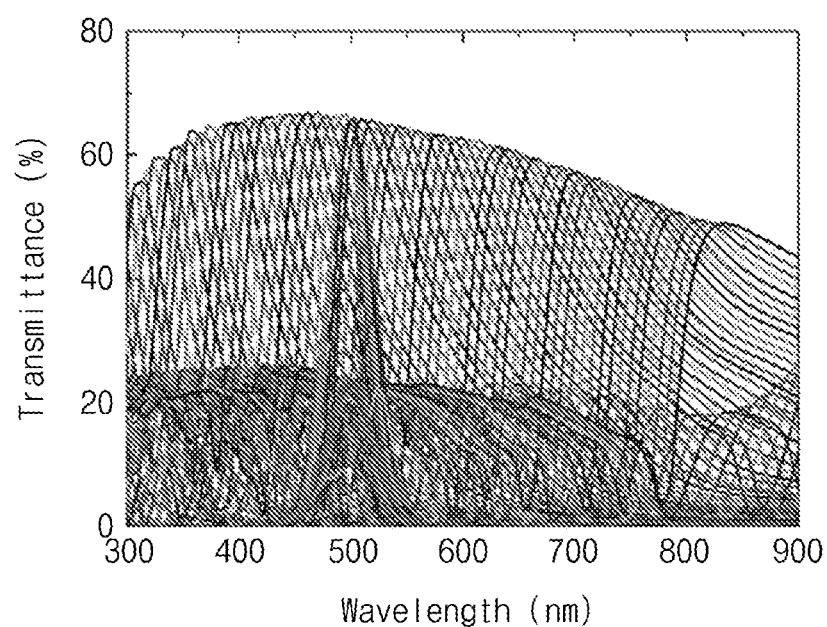
Figure 31:
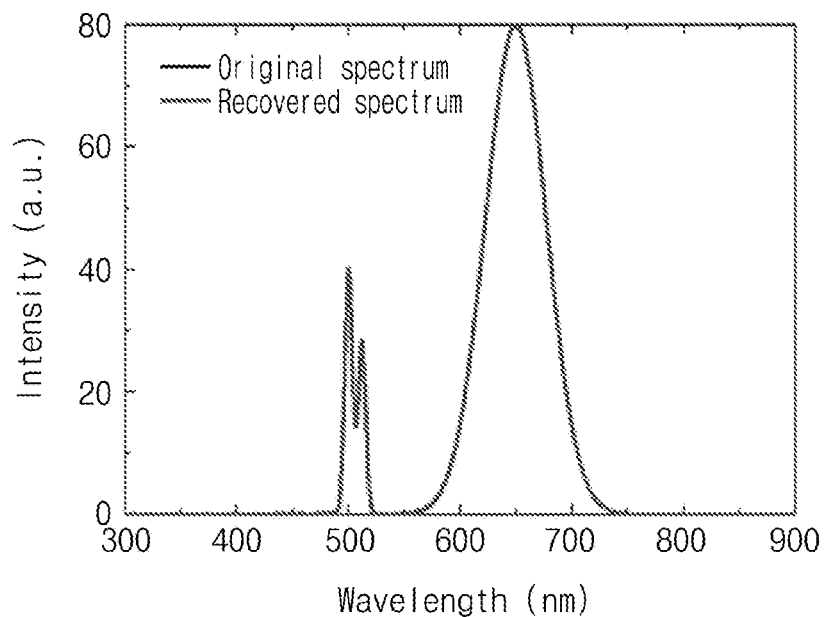

FIGS. 29 to 31 illustrate calculation examples for explaining a method of complementarily using a broadband spectral filter array and a narrowband band-limited filter in an optical device according to Embodiment 8 of the present invention. That is, the spectral filter array itself may be responsible for the restoration of the object spectrum covering the entire broadband operating wavelength range and having a low resolution shape, and may be only responsible for high-resolution operation in a specific region by a combination with a narrowband band-limited filter.

FIG. 29 is a graph comparing a very sharp double peak of FIG. 23 with a view of configuring an object spectrum as Gaussian peaks having a relatively wide half width of 64 nm are mixed and a signal restored spectrum only with the spectral filter array of FIG. 22. It may be seen that the relatively broad Gaussian peak curve is well reconstructed, although the double peak with a very narrow half width and gap is not decomposed.

FIG. 30 shows an example in which the spectrum of the spectral filter array is included in the spectrum of the effective filter function in the process of combining the band-limited filter of FIG. 24 with the EOT-type spectral filter array of FIG. 24. When using this effective filter function, as shown in FIG. 31, the high resolution reconstruction in a specific wavelength band and the low resolution spectrum reconstruction in an arbitrary wavelength band may be simultaneously performed. In other words, it may be efficient to perform restoration through the spectral filter array irrespective of which wavelength band the object spectrum having a proper line width and a gentle curved line exists.

Embodiment 9

Figure 32:
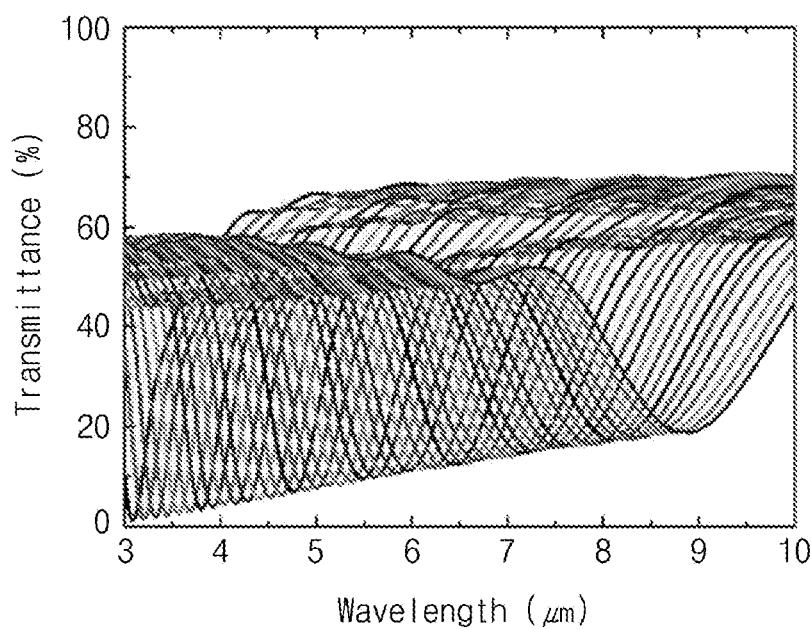
FIGS. 32 to 35 show calculation examples showing that an optical device according to an embodiment of the present invention operates in the same manner even in the mid-infrared wavelength region band.

FIGS. 32 to 35 show calculation examples showing that an optical device according to the present invention operates in the same manner even in the mid-infrared wavelength region band. FIG. 32 shows the distribution of the stop band transmittance spectra calculated in the mid-infrared wavelength band of 3-10 μm for a plasmonic filter composed of an Au nano disk array having a periodic lattice structure. When a 50 nm thick circular Au disk array with a hexagonal lattice structure on a Si substrate is fixed at a duty cycle of 50%, it is the transmittance spectrum calculated by changing the period from 1 to 3 μm at intervals of 40 nm.

Figure 33:
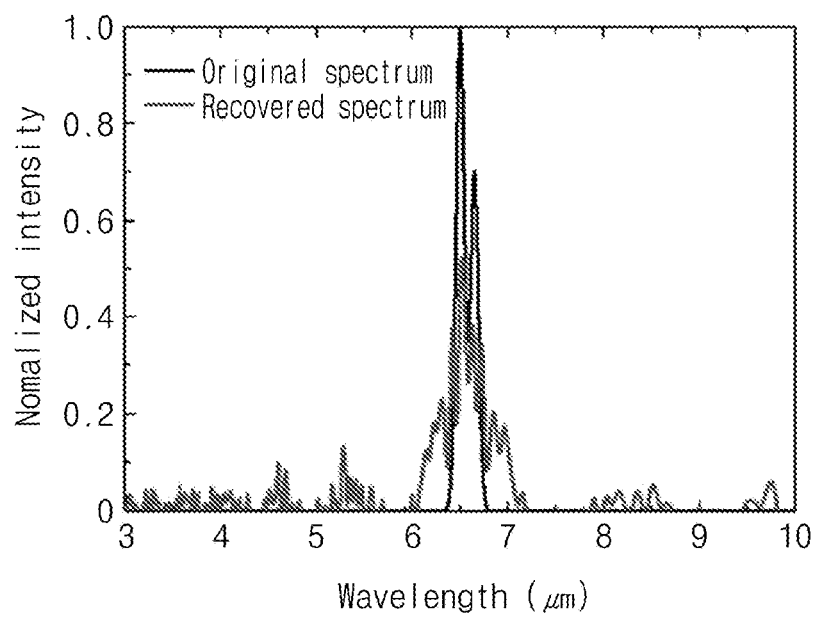

FIG. 33 is a graph comparing the restored spectra restored by applying the signal restoration algorithm in the process of restoring the object spectrum using the spectral filter array shown in FIG. 32 with the original spectra. The target spectrum was assumed to be a double peak curve in which two Gaussian peaks with a half width of 100 nm are spaced 150 nm apart. It may be seen that the number of plasmonic filters used is only 51, and the half width in the mid-infrared band is also very wide, so that the dual peak is not be decomposed and the signal restoration capability is low.

Figure 34:
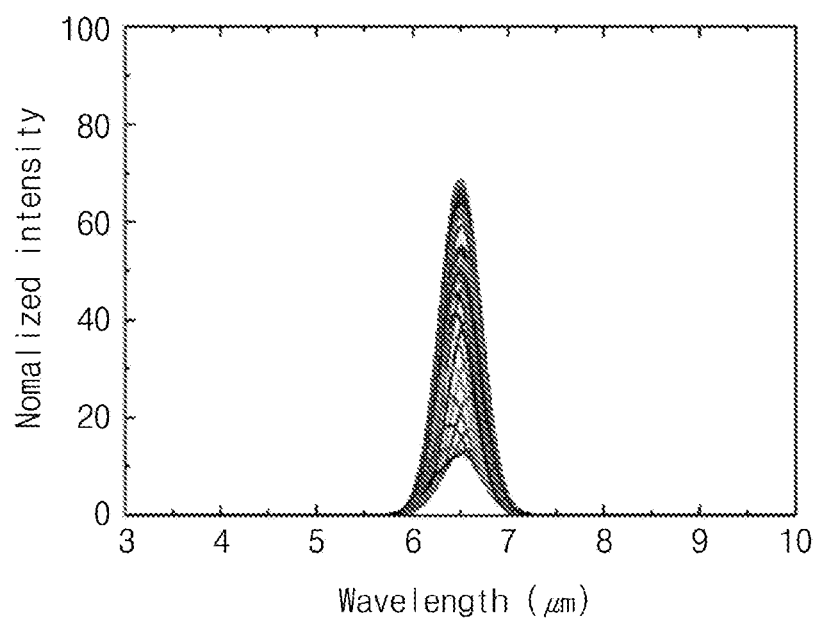
Figure 35:
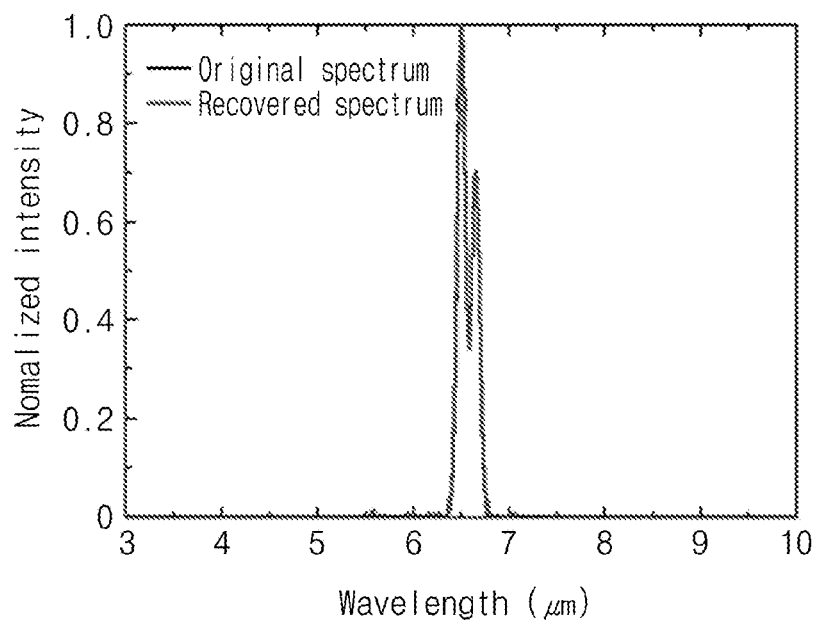

FIG. 34 shows the transmission spectrum of an effective filter function generated when a Gaussian peak function having a half width of 500 nm is applied with a band-limited filter. FIG. 35 is a graph comparing the object spectrum restored when a signal restoration algorithm is executed using an effective filter function according to a combination of a band-limited filter and a plasmonic spectral filter array with the original spectrum. Like visible to near infrared wavelength bands, it may be confirmed that the combination of the spectral filter array and the band-limited filter makes it possible to perform high-resolution signal restoration very effectively in the mid-infrared band.

Embodiment 10

Figure 36:
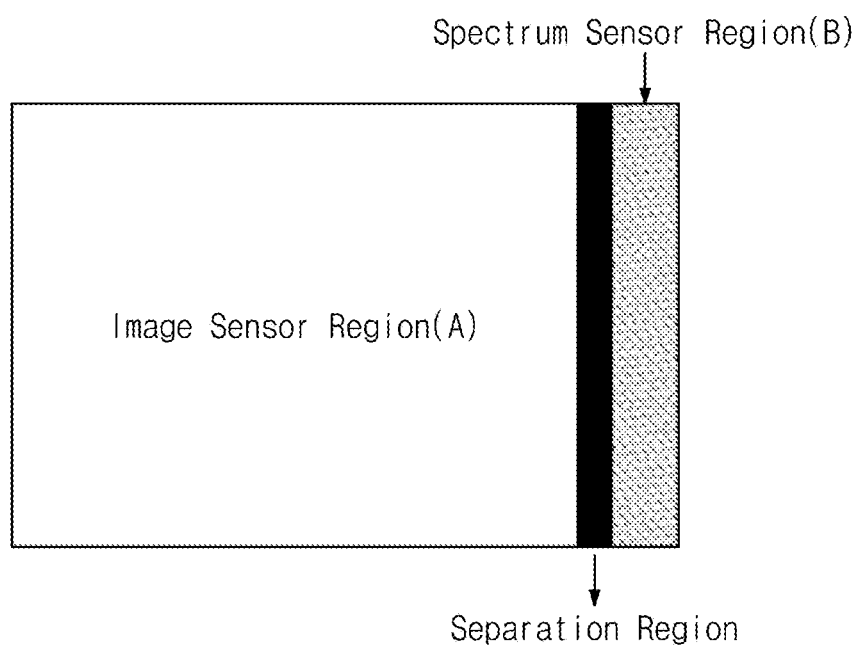
FIGS. 36 to 45 are conceptual diagrams for explaining a situation in which an image sensor and a spectrum sensor are integrated together according to embodiments of the present invention.

FIG. 36 is a conceptual diagram for explaining a situation in which an image sensor and a spectrum sensor are integrated together according to an embodiment of the present invention.

Referring to FIG. 36, an image sensor region A and a spectrum sensor region B are integrated on the same substrate, and are separately formed in spatially separate regions. For example, it shows a situation in which at least a part of the processes is carried out together on a substrate such as a silicon substrate or inside of the substrate so that the final products are formed together on the same substrate. Although FIG. 36 shows that a separate separation area is added between the image sensor region A and the spectrum sensor region B, it is not essential. The image sensor region A and the spectrum sensor region B electrically and physically are separated by using an insulating film or the like. It is also possible to arrange various circuit parts or the like to constitute the separation area.

An image sensor is a sensor that implements an image function may means that the unit pixels are arranged in an array and may include a CMOS image sensor, an infrared image sensor such as a thermal camera, a CCD, or a 1D/2D array optical detector but may be preferably a CMOS image sensor.

Generally, since an operation is made with a wavelength of 380 nm to 1100 nm for Si-based image sensors, 780 nm to 1800 nm for Ge, 500 nm to 2500 nm for InGaAs sensors, and 2 microns to 12 microns or more for MCT (HgCdTe) sensors, the spectral filter should cover this region, but may cover narrower or wider regions depending on the structure and performance of the spectrum sensor, so that the wavelength band of the spectral filter may also be designed and manufactured to decrease or increase accordingly.

On the other hand, FIG. 36 shows that the spectrum sensor region B is disposed only on one side of the image sensor region A. However, in actual implementation, two sides, three sides, four sides, or the like are all possible. It is also possible to implement a spectrum sensor utilizing dummy pixels outside the effective pixels of the image sensor.

Figure 37:
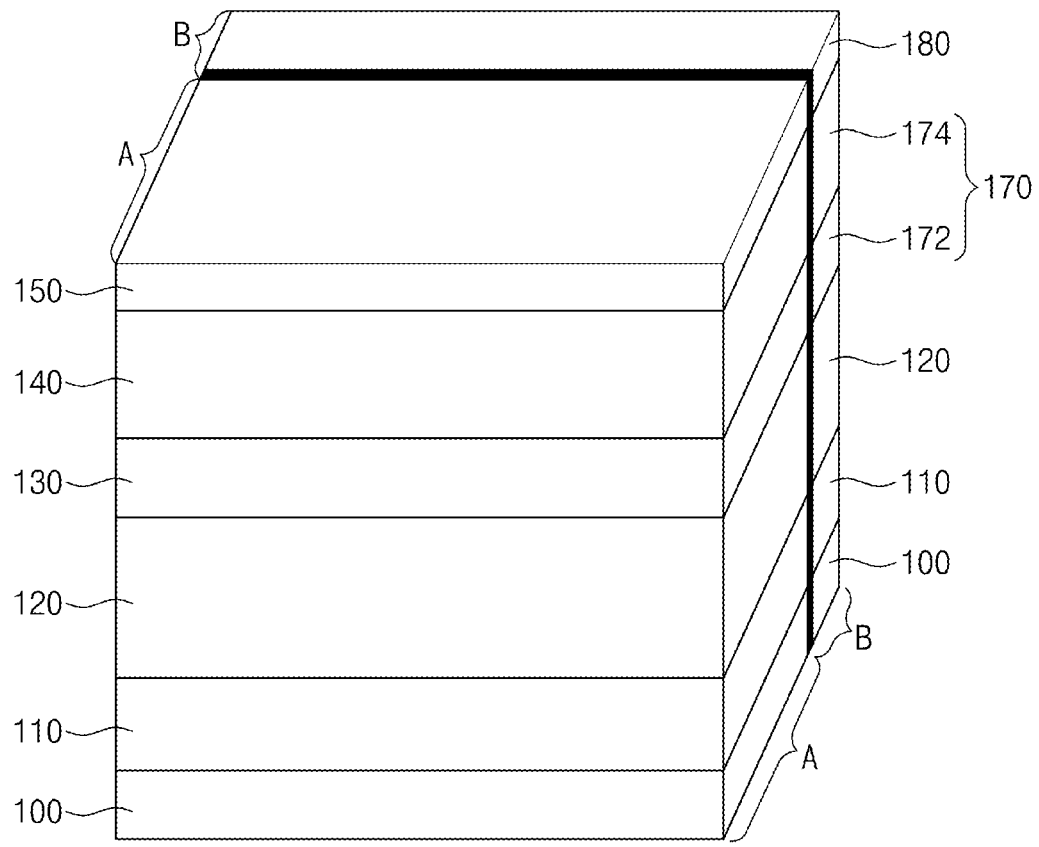

FIG. 37 is an exemplary view showing a cross section of FIG. 36. The image sensor uses a CMOS image sensor as an example. The image sensor region A and the spectrum sensor region B are separately described. When the image sensor region A is described, a light detection region 110 is disposed on or inside a substrate 100, and the light detection region 110 includes an isolation region (not shown) for separating each unit pixel. Then, a metal wiring and an insulating layer 120 having an intermediate dielectric and various electrode lines are provided on the light detection region 110. Then, an R, G, and B filter region 130 is formed thereon, and a planarization layer 140 and microlenses 150 are formed thereon.

When the spectrum sensor region B is described, a light detection region 110 is disposed on or inside a substrate 100, and the light detection region 110 includes an isolation region (not shown) for separating each unit pixel. Then, a metal wiring and an insulating layer 120 having an intermediate dielectric and various electrode lines are provided on the light detection region 110. Then, in the spectrum sensor region B, spectrum sensor filters are disposed on the metal wiring and the insulating layer 120. The spectrum sensor filters 170 include a spectral filter 172 and a band-limited filter 174 for each unit pixel.

In relation to the spectral filter 172, for example, various filters not specifically limited with a wavelength or a structure different from the R G B color filter of the CMOS image sensor, are applicable.

Examples of the spectral filter 172 may include diffraction grating types, prism types, Fabry-Perot type resonant filters, plasmonic filters including a metal nanostructure array or a metal nanohole array, silicon nanowire-based filters, absorbing filters, resonance waveguide resonance mode type filters, and optical interference spectral filter using integrated optics without restrictions. Any type of spectral filters disclosed in the same applicants' applications 2016-0106416, 2016-0106422, 2016-0110789, 2016-0110799, and 2016-0098456 may be applied as filters in the spectrum sensor region B.

For the band-limited filter 174, although the band-limited filter (see FIGS. 15, 26, and 27) and Gaussian function filter are used in the above embodiment, various types of filters such as Lorentz function filters, super Gaussian function filters, flat-top rectangular filters, asymmetric transmission filters, and edge filters with long-wavelength pass filter and short-wavelength pass filter may be used. Additionally, as shown in FIGS. 11 and 12, an RGB filter may be used. This will be described later.

The band-limited filter 174 may be used as a band-limited filter 174 if it electively transmits light without any specific limitation. For example, dye dispersion color filters, Fabry-Perot type transmission band filters, plasmonic filters (metal nanohole arrays, metal nanostructures, etc), metal and dielectric GMR filters, tunable filters (e.g., liquid crystal based or MEMS based Variable filter and the like) and the like may be used.

On the other hand, separate microlenses 180 may not be formed on the spectrum sensor filters 170 formed in the spectrum sensor region B, or may be formed thereon.

It is also possible that additional films are formed between the spectrum sensor filters 170 and the metallization and insulating layer 120, or above the spectrum sensor filters 170. For example, a separate layer such as a planarization film, a protective film, a natural oxide film, or the like may be added between the spectrum sensor filters 170 and the metal wiring and the insulating layer 120, and a passivation film such as a silicon oxide film, a silicon nitride film, or a dielectric film may be added on the spectrum sensor filters 170.

On the other hand, the wavelength bands covered by each unit pixel of the spectrum sensor filters 170 may be different or may be equal to each other in order to distinguish between signals and noise. The band-limited filter 172 is mainly characterized in that the entire spectral filter 172 includes a part of the wavelength band to be grasped.

In data processing, as described above, the shape of the filter function is changed to a long-matrix form, thereby obtaining a gain in the decomposition degree. This corresponds to detailed description with reference to FIGS. 11 to 15 including the embodiment and the data.

Implementations are described. According to an embodiment, it is assumed that a wavelength region to be detected through light detection regions in the spectrum sensor region B is about 300 nm to about 1100 nm, and spectral filters are configured to filter this whole region by several nm or tens of nm. When each spectral filter is configured in units of 10 nm, 80 spectral filters that filter different wavelengths from 300 nm to 310 nm, 310 nm to 320 nm, . . . , 1090 nm to 1100 nm may be configured. In this case, the band-limited filter is configured to have a wavelength band smaller than the wavelength band of 300 nm to 1000 nm. For example, each band-limited filter may use a filter having a band from 300 nm to 500 nm, which is smaller than 300 nm to 1100 nm. Also, as with 200 nm to 500 nm, the spectrum sensor filter may be configured to have a wavelength range of about 300 nm to about 1100 nm, and in this case, even if a region outside the range of 300 nm to 1100 nm is included in the band-limited filter, the function of the band-limited filter is not affected.

Embodiment 11

Figure 38:
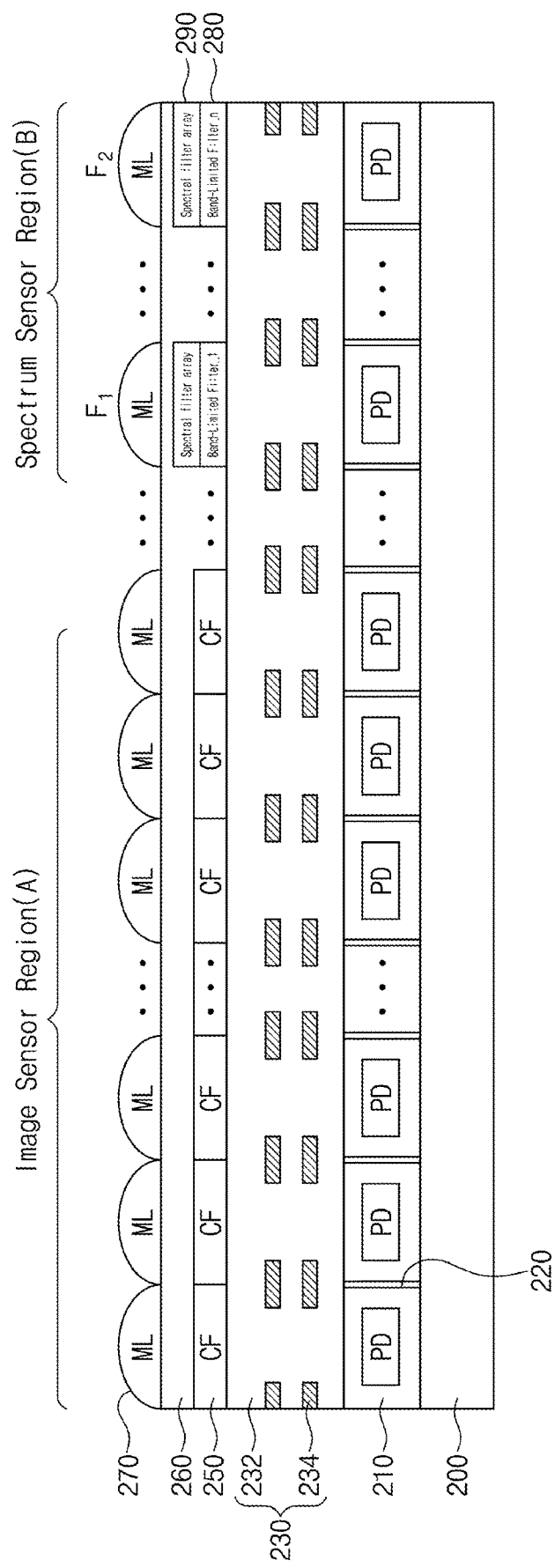

FIG. 38 is a sectional view for explaining a situation in which a CMOS image sensor and a spectrum sensor are integrated together according to an embodiment of the present invention. FIG. 38 corresponds to a detailed sectional view of FIG. 37.

Referring to FIG. 38, a CMOS image sensor region A and a spectrum sensor region B include separate areas and are integrated on the same substrate.

When describing the CMOS image sensor region A, a light detection region 210 is provided on or on a substrate 200, there is an isolation region 220 for separating each unit pixel therebetween, and a metal wiring having an intermediate dielectric and various electrode lines and an insulating layer 230 are provided. Then, the R, G, and B filter region 250 is formed on the R, G, and B filter region 250 and a planarization layer 260 and microlenses 270 are formed in correspondence to each R, G, and B filter region 250.

When describing the spectrum sensor region B, there is a separation region 220 for separating each unit pixel between the light detection regions 210 on the substrate 200 or the substrate portion, and a metal wiring and an insulating layer 230 having an intermediate dielectric and various electrode lines are provided. Then, in the spectrum sensor region B, spectrum sensor filters F1, F2, . . . are disposed on the metal wiring and the insulating layer 230. In relation to the spectrum filter filters F1, F2, . . . , the spectral filter array 290, a band-limited filter_1, . . . , a band-limited filter_n 280 are provided for each unit pixel.

The preferred wavelength band of the spectral filter array 290 basically covers the entire wavelength region which can be detected by the sensor of the photoactive layer, but it is also possible to limit the wavelength range more than the sensor range for special applications. The band-limited filter_1, . . . , the band-limited filter_n 280 include a part of a wavelength band to be detected by the entire spectral filter.

According to an embodiment, it is assumed that a wavelength region to be detected through light detection regions in the spectrum image sensor region B is about 300 nm to about 1000 nm, and spectral filters are configured to filter this whole region by several nm or tens of nm. When each spectral filter is configured in units of 10 nm, 70 spectral filters that filter different wavelengths from 300 nm to 310 nm, 310 nm to 320 nm, . . . , 990 nm to 1100 nm may be configured. In this case, the band-limited filter is configured to have a wavelength band smaller than the wavelength band of 300 nm to 1000 nm. For example, when the detection section of the CMOS image sensor is 300 nm to 1000 nm, the band-limited filter may be composed of seven band-pass filters having intervals of 300 nm to 100 nm. Various filters such as a plasmonic filter are applicable as a band-pass filter. According to another embodiment, when the existing RGB filter is directly used as a band-limited filter, the RGB filter may be used as it is in the section of 700 nm or more. In spectral filters for measuring the section of 700 nm or more, two to three band-pass filters may be configured. It is apparent that a band-pass filter is not limited to various filters such as a plasmonic filter.

Figure 39:
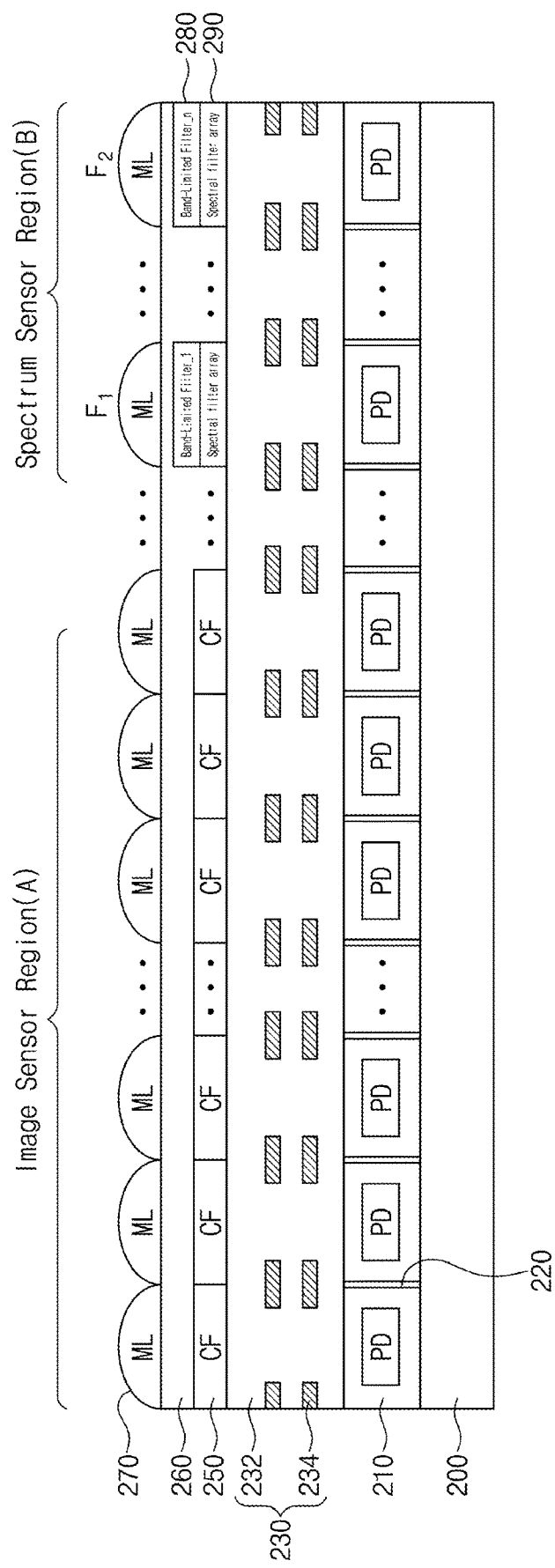

Meanwhile, although it is shown in FIG. 38 that a spectral filter array 290 is provided for each unit pixel on the band-limited . . . , the band-limited filter_n 280, the band-limited filter_1, . . . , the band-limited filter_n 280 may be formed on the spectral filter array 290. FIG. 39 is a diagram illustrating a situation in which a band-limited filter_1, . . . , a band-limited filter_n 280 are formed on a spectral filter array 290. As already mentioned above, the stacking order of the band-limited filter and the spectral filter has no difference in function.

Embodiment 12

Figure 40:
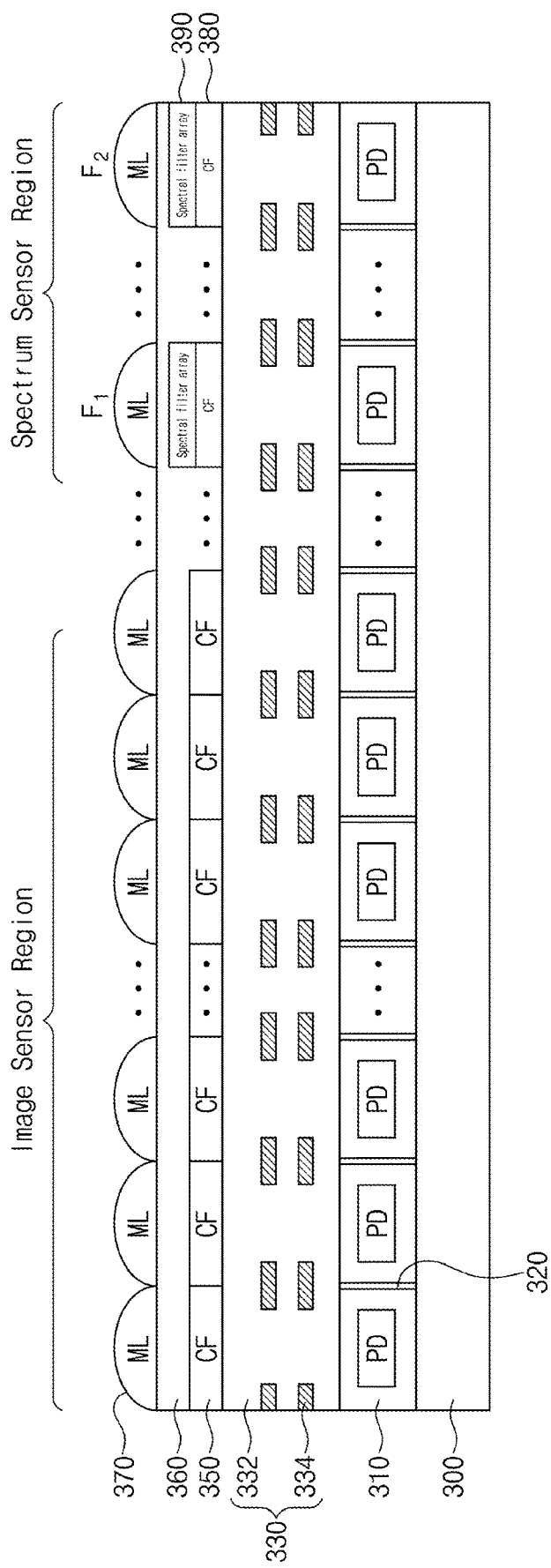

FIG. 40 is a sectional view for explaining a situation in which a CMOS image sensor and a spectrum image sensor are integrated together according to another embodiment of the present invention.

When describing the CMOS image sensor region A, a light detection region 310 is provided on the substrate 300 or the substrate inside, there is a separation region 320 for separating each unit pixel therebetween, and a metal wiring and an insulating layer 330 having an intermediate dielectric and various electrode lines are provided. Then, the R, G, and B filter region 350 is formed on the R, G, and B filter region 350 and a planarization layer 360 and microlenses 370 are formed in correspondence to each R, G, and B filter region 250.

When describing the spectrum sensor region B, there is a separation region 320 for separating each unit pixel between the light detection regions 310 on the substrate 300 or the substrate portion, and a metal wiring and an insulating layer 330 having an intermediate dielectric and various electrode lines are provided.

When explaining the difference from FIG. 39 mainly, in relation to the spectrum sensor filters F1, F2, . . . , the spectral filter array 390 and the band-limited filter_1, . . . , the band-limited filter_n 380 are provided for each unit pixel but the band-limited filter 380 is implemented with a color filter of a CMOS image sensor. If the entire spectral filter has a wavelength band of 300 nm to 700 nm or 300 nm to 1100 nm to be detected, the color filters of the CMOS image sensor provided in the band-limited filter 380 may be any of R, G, and B, which is a partial wavelength region of a wavelength band to be detected by the entire spectral filter, and of course, other types of color filters may be used.

In the case of a visible light region, a band-limited filter may use a conventional RGB filter, and also, infrared filters, infrared-visible light mixing filters, and visible light filters other than RGB color filters may be used according to application purpose. The above and below order of a band-limited filter and a spectral filter are not relevant.

Figure 41:
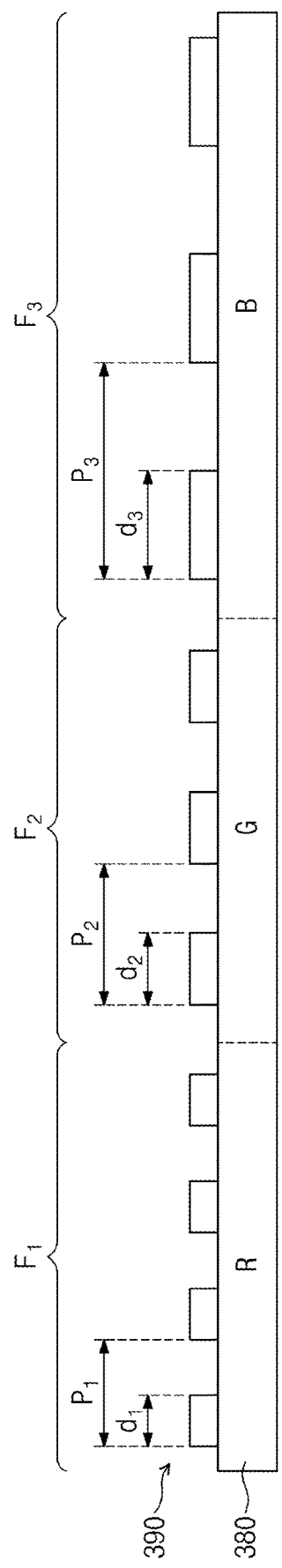
Figure 42:
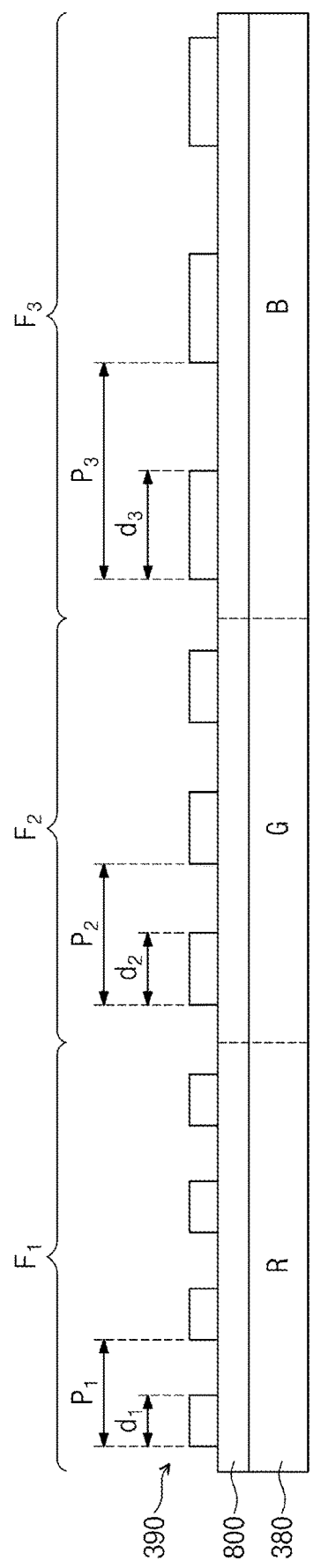
Figure 43:
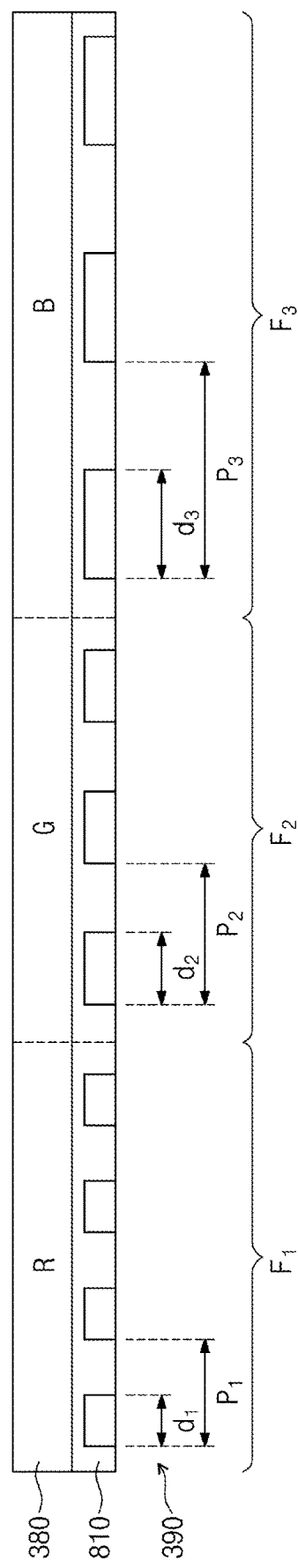

FIGS. 41 to 43 are views showing an example of the spectrum sensor filters F1, F2, and F3 of FIG. 40. As shown in FIGS. 41 to 43, for convenience of explanation, the case of three R, G, and B color filters is shown as an example.

Each of the unit spectral filters F1 and F2 has a spectral filter array 390 and color filters R, G, and B 380. FIGS. 41 and 42 show a case where a spectral filter array 390 is formed on color filters R, G and B 380. FIG. 43 shows a case where color filters R, G and B 380 are formed on the spectral filter array 390.

The spectral filter array 390 is composed of three unit spectral filters, and each exemplifies a filter in which filtering is implemented through a structure in which metal patterns of an embossing shape are periodically arranged. According to an embodiment, since the periods of the unit spectral filters different from the unit spectral filter F1 have different frequencies for filtering, they are configured differently and their duty cycles D/P are configured identically. The duty cycle of each unit spectral filter preferably has 30% to 80%.

FIG. 41 shows a case where a spectral filter array 390 is directly formed on the color filters R, G, and B 380, and FIG. 42 shows a case where a separate planarization layer 800 is formed on the color filters R, G and B 380 and the spectral filter array 390 is formed on the planarization layer 800. On the other hand, as shown in FIG. 43, a planarization layer 810 is formed on a spectral filter array 390, and the color filters R, G, and B 380 are formed on the planarization layer 810.

Figure 44:
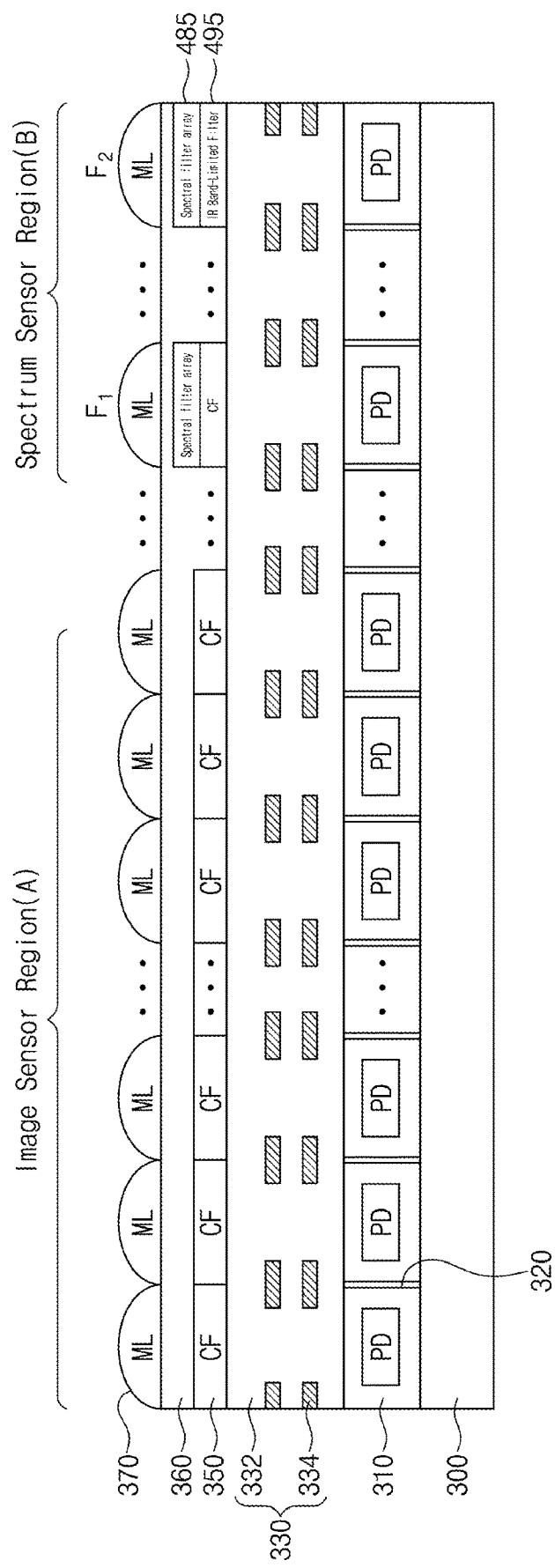

FIG. 44 is a sectional view for explaining a situation in which a CMOS image sensor and a spectrum sensor are integrated together according to another embodiment of the present invention.

When describing the CMOS image sensor region A, a light detection region 210 is provided on the substrate 300 or the substrate portion, there is a separation region 320 for separating each unit pixel therebetween, and a metal wiring and an insulating layer 330 having an intermediate dielectric and various electrode lines are provided. Then, the R, G, and B filter region 350 is formed on the R, G, and B filter region 350 and a planarization layer 360 and microlenses 370 are formed in correspondence to each R, G, and B filter region 250.

When describing the spectrum sensor region B, there is a separation region 320 for separating each unit pixel between the light detection regions 310 on the substrate 300 or the substrate portion, and a metal wiring and an insulating layer 330 having an intermediate dielectric and various electrode lines are provided. Then, in the spectrum sensor region B, spectrum sensor filters F1, F2, . . . are disposed on the metal wiring and the insulating layer 330. In relation to the spectrum filter filters F1, F2, . . . , the spectral filter array 390, band-limited filter_1, . . . , and band-limited filter_n 380 are provided for each unit pixel.

When explaining the difference from FIG. 38 mainly, the pixel size of the spectrum sensor filters F1, F2, . . . formed in the spectrum sensor region B is different from the pixel size of the CMOS image sensor region A. Each light detection region of the spectrum sensor filters F1, F2, . . . may be fabricated in a different size from the light detection region of the CMOS image sensor region A.

The width L2 of each light detection region of the spectrum sensor filters F1, F2, . . . is shown wider than the width L1 of each light detection region of the image sensor region A. It should be understood that this is an example of a situation in which the light incident area in each light detection region of the spectrum sensor filters F1, F2, . . . is designed to be larger than the light incident area of each light detection region of the image sensor region A.

In the case of the spectrum sensor filters F1, F2, . . . , since they filter the wavelength regions that are finer than the R, G, and B filters, relative light intensity may be low so that it is possible to compensate a considerable part thereof with the configuration as shown in FIG. 44.

Meanwhile, if necessary, it is also possible that the size of each light detection region of the spectrum sensor filters F1, F2, . . . is configured to be smaller than or equal to the pixel size of the light detection region of the CMOS image sensor region A.

Embodiment 12

Figure 45:
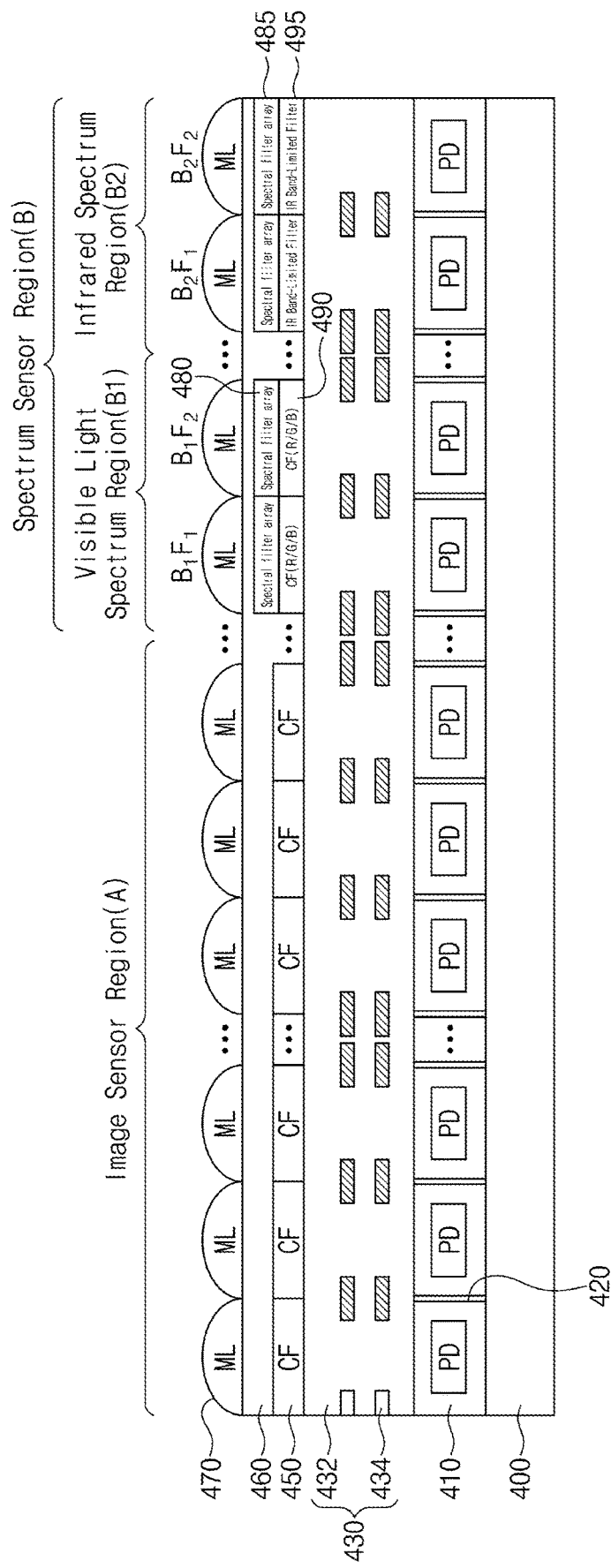

FIG. 45 is a sectional view for explaining a situation in which a CMOS image sensor and a spectrum image sensor are integrated together according to another embodiment of the present invention.

When describing the CMOS image sensor region A, a light detection region 410 is provided on the substrate 400 or the substrate inside, there is a separation region 420 for separating each unit pixel therebetween, and a metal wiring and an insulating layer 430 having an intermediate dielectric and various electrode lines are provided. Then, the R, G, and B filter region 450 is formed on the R, G, and B filter region 450 and a planarization layer 460 and microlenses 470 are formed in correspondence to each R, G, and B filter region 250.

When describing the spectrum sensor region B, there is a separation region 420 for separating each unit pixel between the light detection regions 410 on the substrate 400 or the substrate inside, and a metal wiring and an insulating layer 430 having an intermediate dielectric and various electrode lines are provided.

On the other hand, the spectrum sensor region B is provided with a visible light spectrum region B1 and an infrared spectrum region B2. In relation to the spectrum sensor filters B1F1, B1F2, . . . of the visible light spectrum region B1, a spectral filter array 490 and a color filter 480 are provided for each unit pixel. The spectrum sensor filters B1F1, B1F2, . . . of the visible light spectrum region B1 performs a function for detecting the wavelength band of visible light. In relation to the spectrum sensor filters B2F1, B2F2, . . . of the visible light spectrum region B2, a spectral filter array 495 and a color filter 485 are provided for each unit pixel.

As shown in FIG. 45, although the planarization layer 460 and the microlenses 470 are provided in both the visible light spectrum region B1 and the infrared spectrum region B2, if necessary, it is also possible that the planarization layer 460 is removed from either the visible light spectrum region B1 or the infrared spectrum region B2, or is removed from both. Likewise, it is also possible that the microlenses 470 and the planarization layer 460 are removed from a portion of the visible light spectrum region B1 and the infrared spectrum region B2, or removed from both.

According to an embodiment, it is assumed that a wavelength region to be detected through light detection regions in the spectrum sensor region B is about 300 nm to about 1100 nm, and spectral filters are configured to filter this whole region by several nm or tens of nm. When each spectral filter is configured in units of 10 nm, 80 spectral filters that filter different wavelengths from 300 nm to 310 nm, 310 nm to 320 nm, . . . , 1090 nm to 1100 nm may be configured. In this case, in relation to the band-limited filter, R, G, and B color filters may perform the role of the band-limited filter in the visible light spectrum region B1 and a band-limited filter having a separate infrared band may be added in the infrared spectrum region B2. For example, in this case, the infrared band-limited filter 495 may be a filter that transmits the 700 nm to 1100 nm band in the infrared band, and may be filters that separates the band into a plurality of bands to filter different wavelength bands in the infrared region (e.g., a band of 700 nm to 1100 nm band or 700 nm to 1100 nm or more).

The above-described filter is not limited to the configuration and the method of the embodiments described above, but the embodiments may be configured by selectively combining all or some of the embodiments so that various modifications may be possible. It is apparent to those skilled in the art that the present invention may be specified in a different specific form without departing from the scope and essential features of the present invention. Therefore, the foregoing detailed description is to be regarded as illustrative and not restrictive. The scope of the present invention should be determined only by the reasonable interpretation of the appended claims so as to encompass all such modifications and equivalents.

The invention claimed is:

1. An optical module comprising:
   a spectral filter array including a plurality of unit spectral filters;
   a band-limited filter configured to selectively transmit light of a wavelength region narrower than a wavelength region designed to be measured through the spectral filter array; and
   an optical detection unit configured to detect an optical signal passing through the spectral filter array and the band-limited filter,
   wherein the spectral filter array is configured to absorb light or reflect light of a specific wavelength region.

2. The optical module of claim 1, wherein the spectral filter array is disposed between the band-limited filter and the optical detection unit.

3. The optical module of claim 1, wherein the unit spectral filters are one of a diffraction grating filter, a prism filter, a Fabry-Perot resonance filter, a plasmonic filter having a metal nanostructure array or a metal nanohole array, a silicon nanowire-based filter, an absorption filter, a resonance waveguide resonance mode type filter, or an optical interference spectral filter using integrated optics.

4. The optical module of claim 1, wherein the spectral filter array comprises a plurality of unit spectral filters in which metal patterns having a predetermined shape are periodically arranged.

5. The optical module of claim 1, wherein the band-limited filter is composed of a plurality of unit band-limited filters for selectively transmitting light of different wavelength regions.

6. The optical module of claim 5, wherein the band-limited filter comprises three to seven unit defining filters, and the optical detection unit is a CMOS image sensor.

7. The optical module of claim 5, wherein the unit band-limited filter comprises one or a plurality of R, G, and B color filters.

8. The optical module of claim 5, wherein the one or plurality of unit band-limited filters selectively transmit light of a certain region within 700 nm to 1100 nm.

9. The optical module of claim 1, wherein the optical detection unit is an optical detection pixel of a CMOS image sensor or an infrared image sensor.

10. The optical module of claim 1, wherein a size of a light detection pixel of the optical detection unit is smaller than a size of the unit spectral filter.

11. The optical module of claim 1, further comprising a processing unit configured to perform a signal restoration function of restoring a spectrum of an incident light using an optical signal detected by the optical detection unit.

12. The optical module of claim 11, wherein in restoring the spectrum of the light, a filter function matrix is configured by adding a set of a combination of a spectral filter and a band-limited filter in a column direction.

13. The optical module of claim 11, wherein in the signal restoration function, a filter function matrix for signal restoration is such that a range of a wavelength sampling region is effectively limited by a band-limited filter and a matrix value out of an effective wavelength range is converged to zero.

14. An optical device comprising:
an image sensor region including a color filter layer configured to filter an incident light to at least R, G, and B, and a first light detection region configured to detect an optical signal passing through the color filter layer using a plurality of first unit pixels; and
a spectrum sensor region including a spectral filter array configured to measure a spectrum of a target object and a second light detection region configured to detect an optical signal passing through a spectral filter array through a plurality of second unit pixels; and
a band-limited filter having a wavelength region narrower than an operating wavelength bank to be measured through the spectral filter array on a path of an optical signal of the spectrum sensor region.

15. The optical device of claim 14, further comprising a band-limited filter having a wavelength region narrower than an operating wavelength band to be measured through the spectral filter array on a path of an optical signal of the spectrum sensor region.

16. The optical device of claim 14, wherein the spectral filter array and the band-limited filter are stacked, and the band-limited filter is disposed on the spectral filter array.

17. The optical device of claim 15, wherein the spectral filter array and the band-limited filter are stacked, and the spectral filter array is disposed on the band-limited filter.

18. The optical device of claim 15, wherein the band-limited filter comprises a plurality of unit band-limited filters configured to selectively transmit light of different wavelength regions.

19. The optical device of claim 18, further comprising the unit-defining filter which includes one or a plurality of R, G, and B color filters.

20. The optical device of claim 18, wherein the one or plurality of unit band-limited filters selectively transmit light of a certain region within 700 nm to 1100 nm.

* * * * *